(12) United States Patent
Kimura

(10) Patent No.: US 7,279,673 B2
(45) Date of Patent: Oct. 9, 2007

(54) SENSOR, SCANNER AND PORTABLE INFORMATION TERMINAL EACH HAVING LIQUID CRYSTAL DISPLAY

(76) Inventor: Hajime Kimura, c/o Semiconductor Energy Laboratory Co., Ltd., 398, Hase, Atsugi-shi, Kanagawa-ken 243-0036 (JP)

( * ) Notice: Subject to any disclaimer, the term of this patent is extended or adjusted under 35 U.S.C. 154(b) by 0 days.

(21) Appl. No.: 11/053,852

(22) Filed: Feb. 10, 2005

(65) Prior Publication Data

US 2005/0161675 A1 Jul. 28, 2005

Related U.S. Application Data

(62) Division of application No. 09/849,975, filed on May 8, 2001, now abandoned.

(30) Foreign Application Priority Data

May 8, 2000 (JP) .............................. 2000-135239

(51) Int. Cl.
*G01J 1/42* (2006.01)
*H04N 1/04* (2006.01)
(52) U.S. Cl. ..................... 250/208.2; 358/482
(58) Field of Classification Search ............. 250/208.1, 250/556, 208.2; 358/474, 482–484; 345/173, 345/207
See application file for complete search history.

(56) References Cited

U.S. PATENT DOCUMENTS

| 5,149,955 | A | | 9/1992 | Kitamura et al. | ........... 257/435 |
| 5,446,290 | A | * | 8/1995 | Fujieda et al. | ............. 250/556 |
| 5,835,142 | A | | 11/1998 | Nakamura et al. | .......... 348/335 |
| 5,877,492 | A | | 3/1999 | Fujieda et al. | ........... 250/208.1 |
| 5,920,401 | A | * | 7/1999 | Street et al. | ................ 358/400 |
| 6,421,468 | B1 | | 7/2002 | Ratnakar et al. | ............ 382/254 |

FOREIGN PATENT DOCUMENTS

| JP | 08079444 A | * | 3/1996 |
| JP | 09-219823 | | 8/1997 |

OTHER PUBLICATIONS

Yamaguchi, M. et al., "Two-Dimensional Contact-Type Image Sensor Using Amorphous Silicon Photo-Transistor", Japanese Journal of Applied Physics, vol. 32, No. 1B, Jan. 1993, pp. 458-461.

* cited by examiner

Primary Examiner—Thanh X. Luu

(57) ABSTRACT

To provide a close contact type sensor promoting a light utilizing efficiency, there is provided a close contact type sensor featured in that in a close contact type sensor having a sensor circuit portion and an irradiation window portion, a plurality of the irradiation windows are arranged and positions and sizes of the irradiation windows are matched to positions and sizes of opening portions of LCD utilized as a light source.

14 Claims, 31 Drawing Sheets

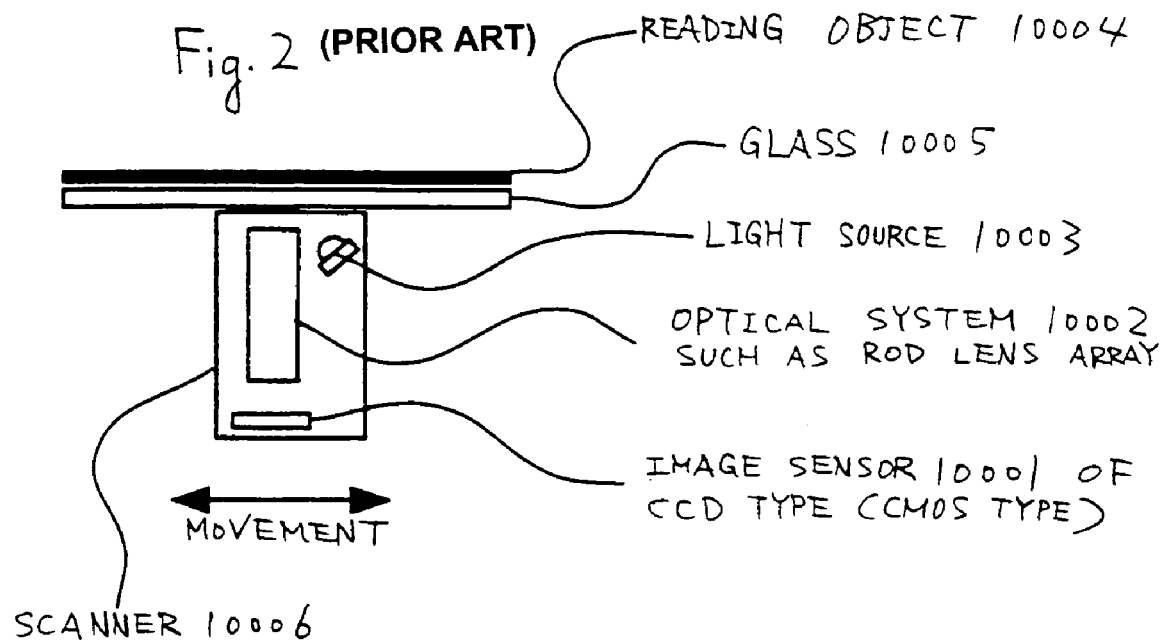
Fig. 2 (PRIOR ART)
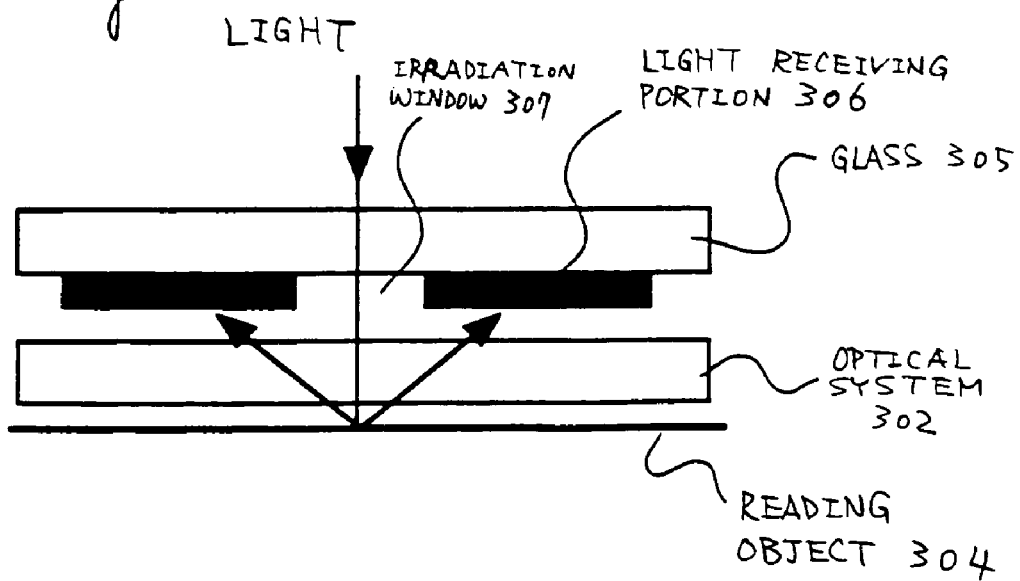
Fig. 3 (PRIOR ART)

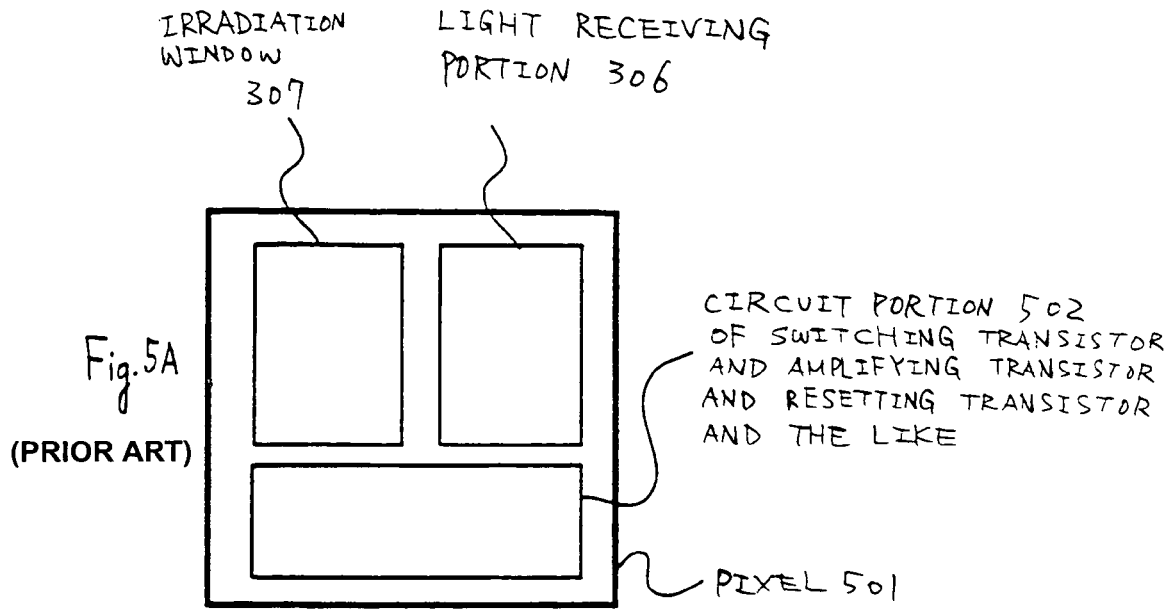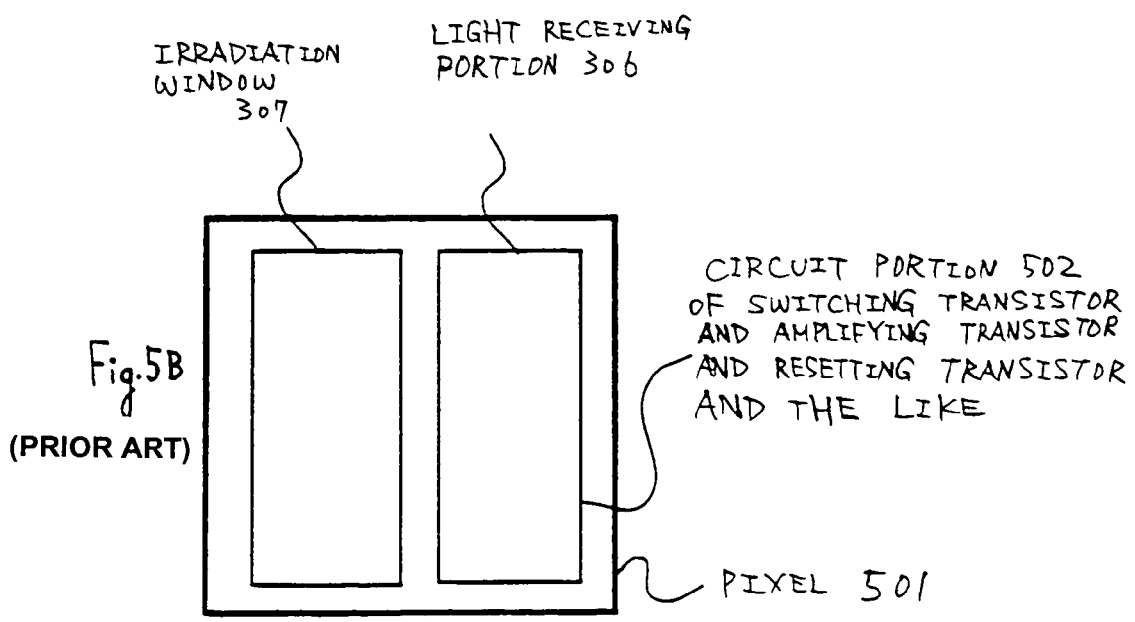

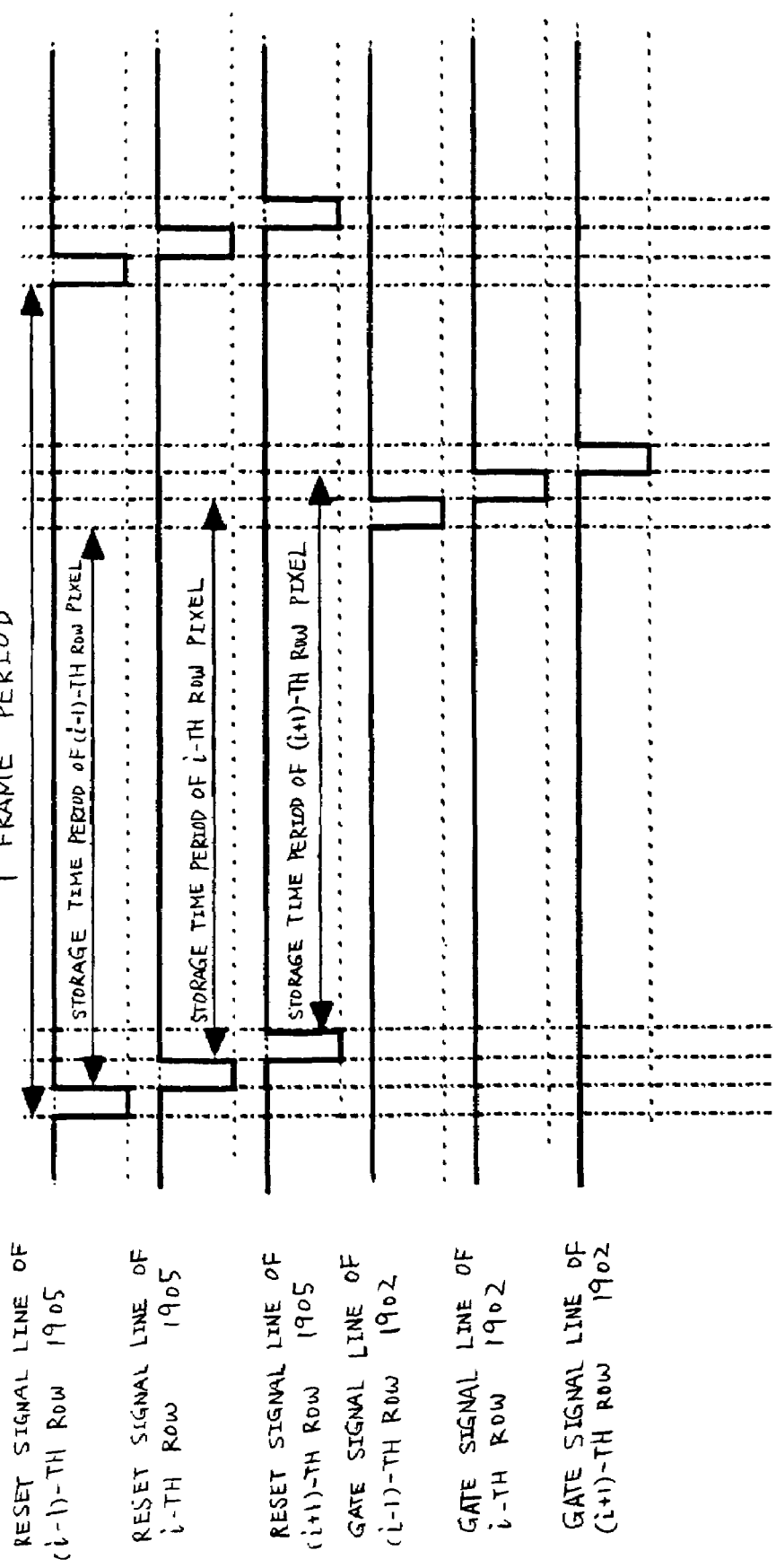

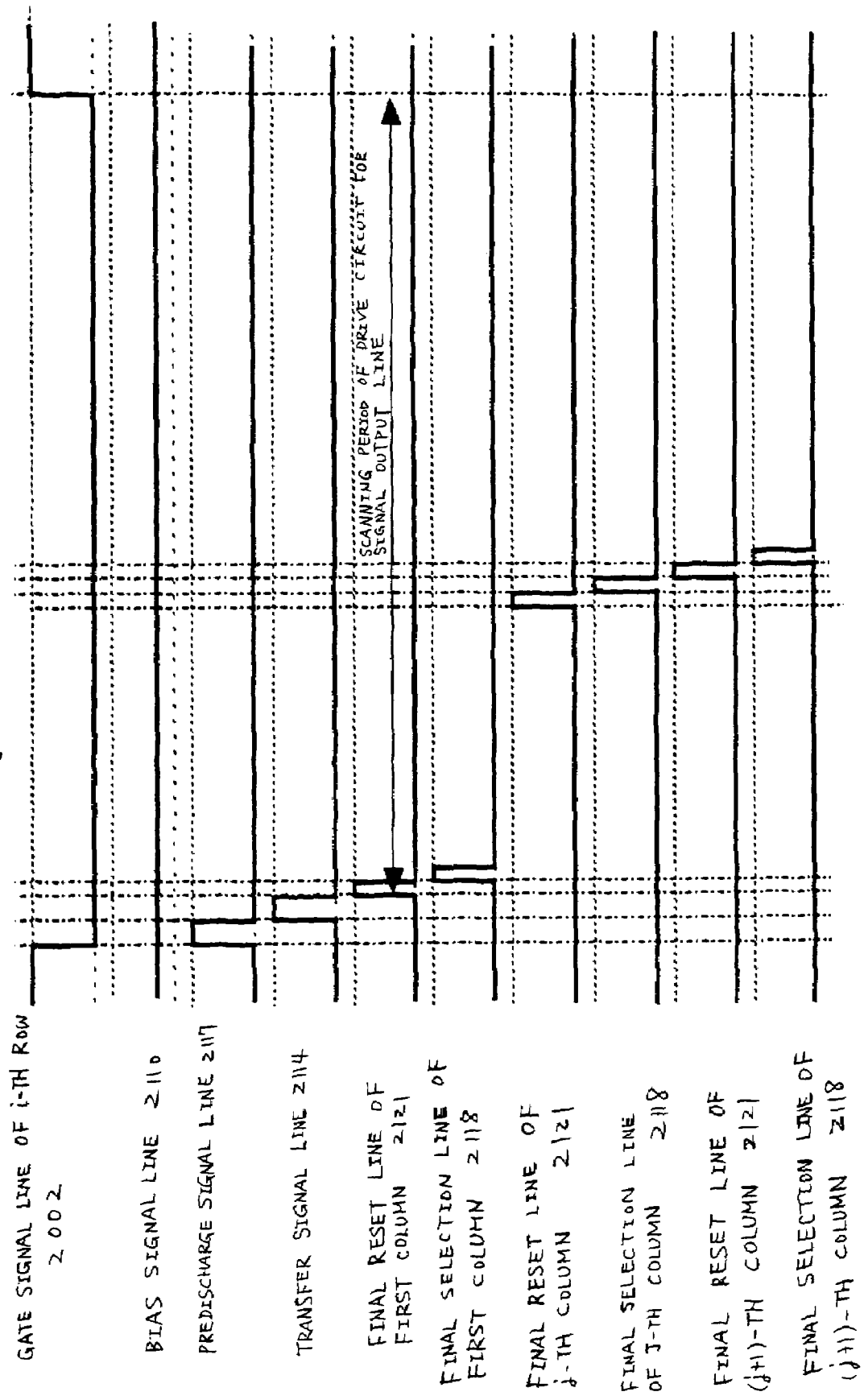

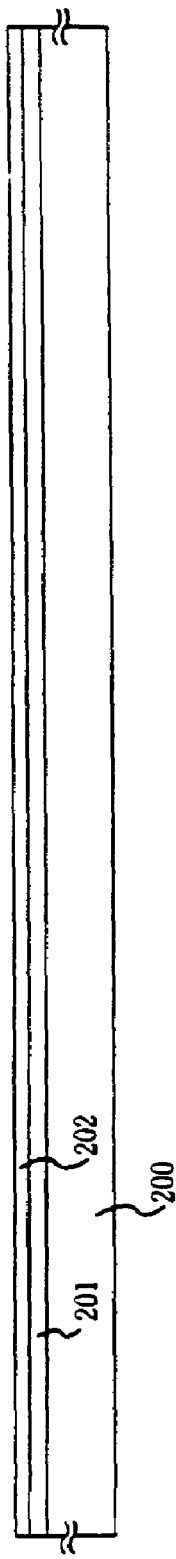
Fig. 26A CRYSTALLIZATION STEP
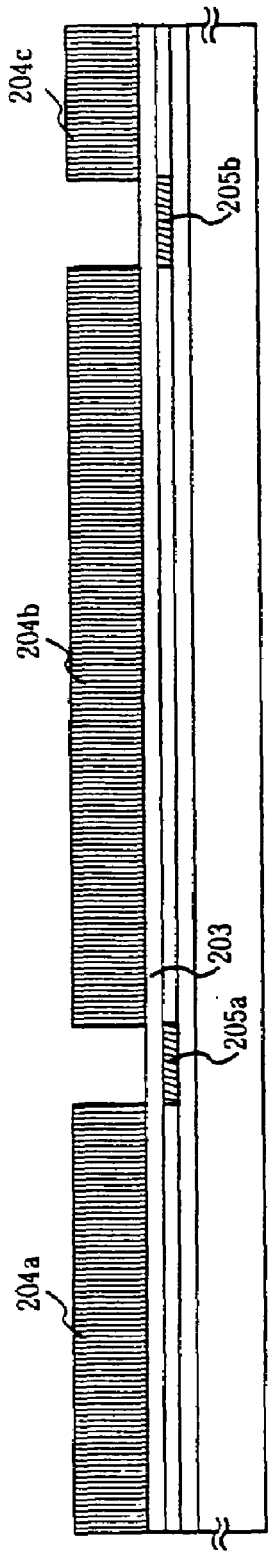
Fig. 26B
Fig. 26C LASER ANNEALING STEP
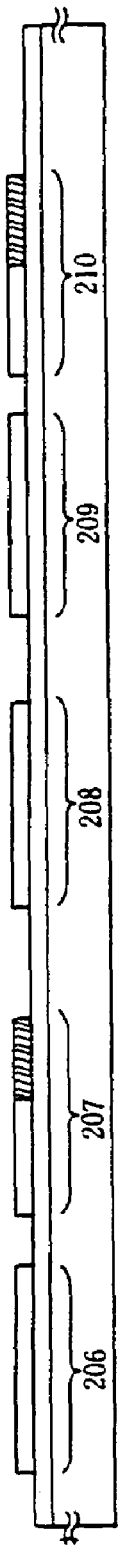
Fig. 26D

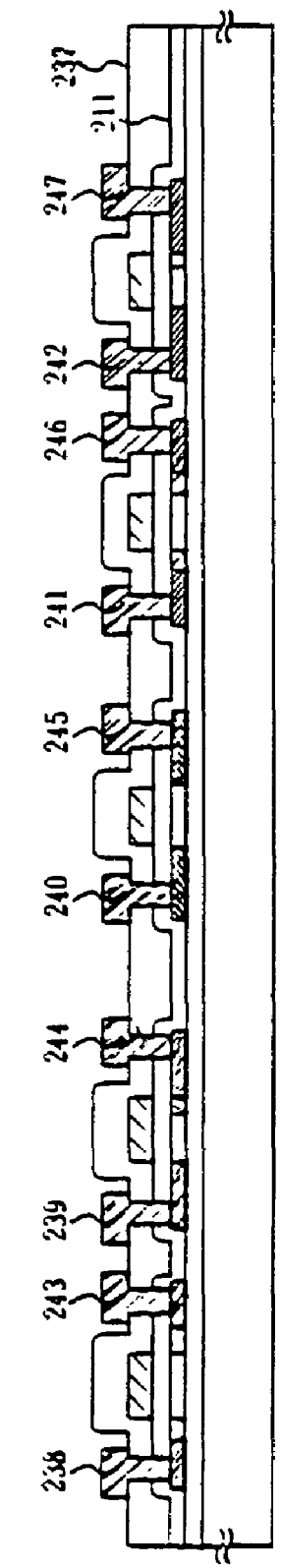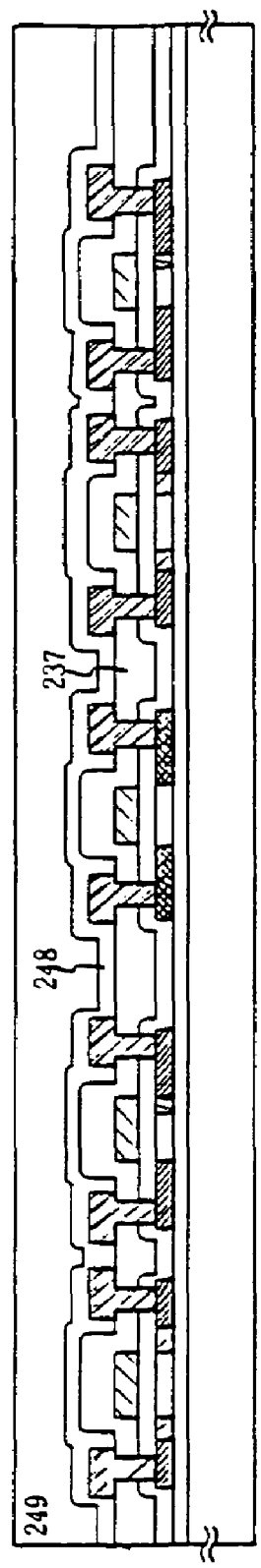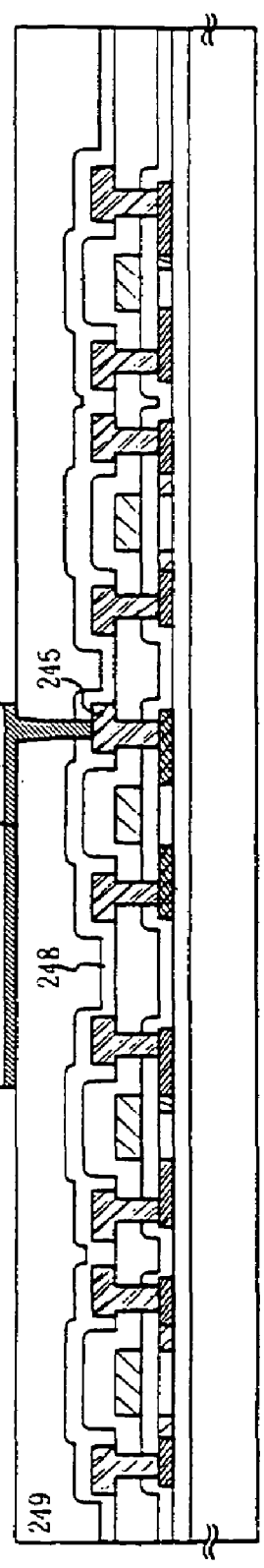
Fig. 28A
Fig. 28B
Fig. 28c

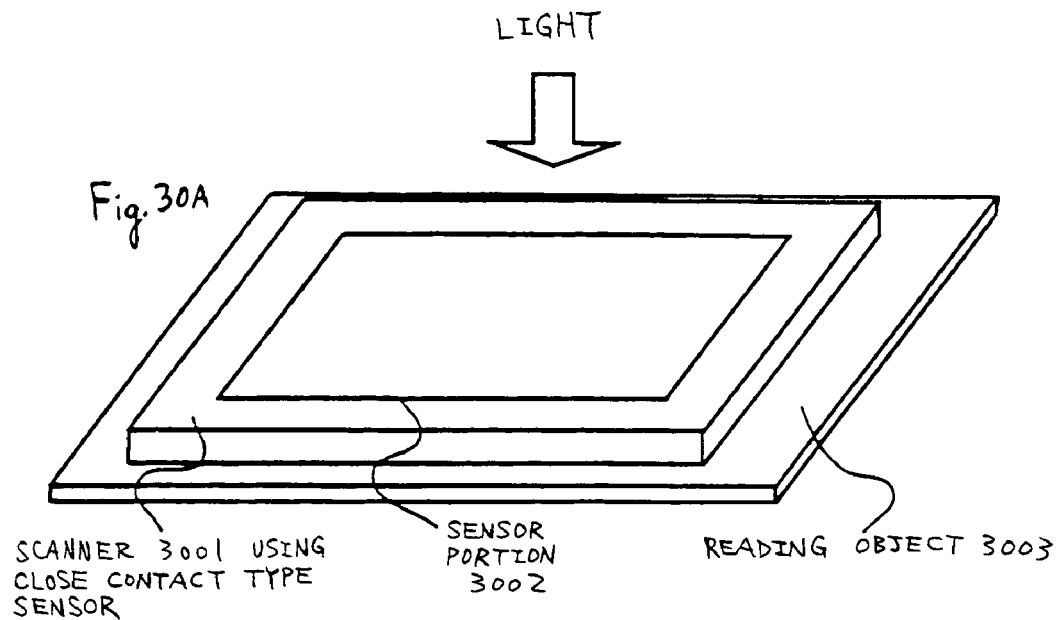
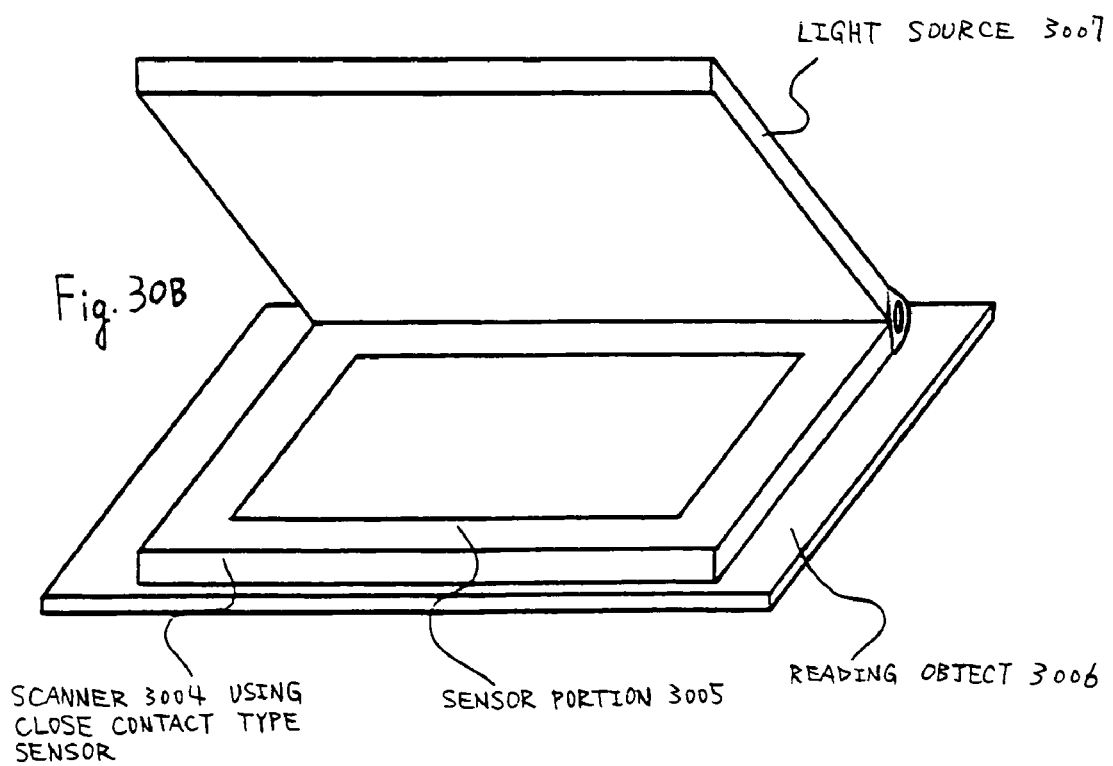

SENSOR, SCANNER AND PORTABLE INFORMATION TERMINAL EACH HAVING LIQUID CRYSTAL DISPLAY

CROSS-REFERENCE TO RELATED APPLICATIONS

This application is a divisional application of U.S. application Ser. No. 09/849,975, filed May 8, 2001 now abandoned, which claims the benefit of a foreign priority application filed in Japan as Serial No. 2000-135239 on May 8, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a close contact type sensor. More in details, the present invention relates to an MOS type sensor apparatus formed by using TFT above a glass substrate.

2. Description of the Related Art

In recent years, information apparatus such as personal computers have spread widely and there has been an increase in request of reading various information by a personal computer as electronic information. Therefore, a digital still camera as a substitute for a conventional silver film camera and a scanner as means for reading printed matter printed on paper, considerably attract attention.

In a digital still camera, there is used an area sensor in which pixels in an image sensor portion are arranged two-dimensionally. In a scanner or a copy machine, there is used a line sensor in which pixels in an image sensor portion are arranged one-dimensionally.

Scanners are generally classified grossly into three types in accordance with a reading system. That is, scanners can grossly be classified into three types of (1) sheet feed type, (2) flat bed type and (3) pen type (handy type). (1) Sheet feed type is a system of fixing an image sensor portion of a scanner and reading draft by moving the draft by sheet feeding. (2) Flat bed type is a system of fixing draft on glass and reading the draft by moving an image sensor portion below glass. (3) Pen type is a system of reading draft by moving an image sensor portion above the draft by an operator. In this way, a line sensor is frequently used in a scanner.

In the above-described three scanner types, optical systems used therefor are substantially determined. In a scanner of (2) flat bed type, there is frequently adopted a reduction type optical system for finely reading an image. A lens used for the reduction type optical system is provided with a long focal length and accordingly, a distance between an object for reading and an image sensor portion is lengthened and the apparatus is large-sized.

It is necessary to downsize the apparatus in the case of (1) sheet feed type or (3) pen type (handy type). Therefore, there is adopted an optical system complying therewith. That is, there is frequently adopted a close contact type optical system. According to a close type optical system, there is arranged a rod lens array between an image sensor and an object for reading. A rod lens array is bundled with a number of distributed refractive index type lenses in a rod like shape. A rod lens array focuses an image in a one-to-one relationship and a distance between an object for reading and an image sensor portion is shorter than that of a reduction optical system.

As an optical system aiming at further downsizing of the apparatus by further shortening a distance between an object for reading and an image sensor portion, there is provided a completely close contact type. This is an optical system for reading an object for reading by bringing the object and an image sensor portion substantially into close contact with each other without arranging a lens therebetween. A protective film, thin protective glass or an optical fiber plate is arranged between the object for reading and the image sensor portion. The optical fiber plate is constituted by bundling a number of optical fibers and slicing the bundle in a shape of a plate.

There is introduced the above-described classification of optical systems in "A close contact image sensor infiltrating facsimiles, expels a reduction type with easiness-to-use as an arm?" in Nikkei Electronics: Apr. 3, 1989 (No. 470): p. 159. There is introduced a rod lens array using a distributed reflective index type lens in "Mass production of a lens array made of plastic for close contact sensors of facsimiles" in Nikkei Electronics: Nov. 13, 1989 (No. 486): p. 122. There is introduced an example of a completely close contact type in "Development of a CdS—CdSe image sensor of a completely close contact type" in Nikkei Electronics: Feb. 19, 1990 (No. 493): p. 112. There is introduced an example of completely close contact type using an optical fiber plate in "Development of a completely close contact type image sensor of a multiple tips system" Nikkei Electronics: Sep. 14, 1992 (No. 563): p. 80.

As an image sensor element, there is frequently used a sensor of a CCD type or a single crystal CMOS type. FIG. 2 shows a sectional view in the case of adopting a close contact type optical system by using these elements. There is arranged an optical system 10002 such as a rod lens array above an image sensor 10001 of a CCD type (CMOS type). The optical system 10002 is used for projecting an image on a draft onto the image sensor 10001. The relationship between the image and the sensor is constituted by an equal magnification system. A light source 10003 is arranged at a position capable of irradiating light to a reading object 10004. LED or a fluorescent lamp is used as a kind of the light source used. Further, glass 10005 is arranged at the topmost portion. The reading object 10004 is arranged on the glass 10005. The operation is as follows. First, light emitted from the light source 10003 passes through the glass 10005 and is incident on draft. Further, the light is reflected by the reading object 10004, passes through the glass 10005 and is incident on the optical system 10002. The light incident on the optical system 10002 is incident on the image sensor 10001 and is photoelectrically converted at the image sensor 10001. Further, a signal converted into electricity is read to outside. After reading signals of one column by the image sensor, a scanner 10006 is moved and similar operation is repeated again.

As a constitution of using other image sensor element, there is provided a sensor formed with TFTs and photodiodes by using a-Si or p-Si above glass. FIG. 3 shows a sectional view of a line sensor when a completely close contact type optical system is adopted by using these elements. According to a completely close contact type, it is necessary to efficiently irradiate light to a reading object 304. Therefore, it is preferable that a substrate per se is transparent. Therefore, in a completely close contact type, not a single crystal substrate which does not transmit light but transparent glass is frequently used. In FIG. 3, a light receiving portion 306 is formed at glass 305 and a vicinity of the light receiving portion 306 is formed with an irradiation window 307 for transmitting light. Light emitted from a light source 303 is incident on a rear face of the glass 305, passes through the irradiation window 307, passes through an optical system 302 and is incident on a reading object 304. Light incident on the reading object 304, is reflected thereby, passes through the optical system 302 again and is incident on the light receiving portion 306. A light shielding window is frequently formed between the glass 305 and the light receiving portion 306 at portions other than the irradiation window 307 to prevent influence of light incident on the rear face of the glass 305 from being effected.

FIGS. 4A and 4B show views viewing from above a pixel of a sensor fabricated on glass. In FIG. 4A, a single piece of the irradiation window 307 is arranged at the center of one pixel of the light receiving portion 306. In FIG. 4B, a single piece of the irradiation window 307 is arranged contiguous to one pixel of the light receiving portion 306. These are published also in "A close contact image sensor infiltrating facsimiles, expel the reduction type with easiness-to-use as an arm?" in Nikkei Electronics: Apr. 3. 1989 (No. 470): p. 159. In this way, conventionally, a single piece of pixel is arranged with only a single piece of irradiation window.

FIGS. 5A and 5B show simple constitution views each for a single piece of pixel. In FIG. 5A, there is a single piece of the irradiation window 307 and there is the light receiving portion 306 for carrying out photoelectric conversion contiguous thereto. There is arranged therebelow, a circuit portion 502 of a switching transistor, a resetting transistor, am amplifying transistor and the like for resetting the light receiving portion 306 or amplifying a signal produced at the light receiving portion 306. The light receiving portion 306 and the circuit portion 502 in combination, is referred to as a sensor circuit portion. That is, a single piece of a pixel 501 is constituted by the sensor circuit portion and the irradiation window portion 307 and a plurality of the pixels 501 are arranged to thereby constitute a line sensor or an area sensor.

FIG. 5B is basically the same as FIG. 5A and is a constitution view when the light receiving portion 306 and the circuit portion 502 are arranged to overlap. It is necessary that the irradiation window 307 is transparent since light needs to transmit therethrough. Therefore, the irradiation window 307 and the circuit portion 502 are not arranged to overlap. Meanwhile, the light receiving portion 306 and the circuit portion 502 can be arranged to overlap since there is not such a restriction.

A description has been given of the case of using a line sensor. However, when a two-dimensional reading object is read by a line sensor, it is necessary to move the sensor or the reading object. Therefore, the apparatus is large-sized, reading speed is retarded or mechanical strength is weakened. Hence, researches have been carried out also on a close contact type area sensor arranged with pixels two-dimensionally. In order to make light incident on a reading object, a substrate needs to transmit light and therefore, the substrate needs to be transparent, for example, the substrate comprises glass. According to an area sensor, the pixels are arranged two-dimensionally and therefore, it is not necessary to move the area sensor in reading. Such a close contact type area sensor is published in "Amorphous Silicon Two-Dimensional Image Sensor and Its Application" Television Society Technical Report: Mar. 4, 1993: p. 25 or "Two-Dimensional Contact-Type Image Sensor Using Amorphous Silicon Photo-Transistor" Jpn. J. Appli. Phys. vol. 32 (1993) pp. 458-461.

Further, a description is given of a close contact type area sensor also in Japanese Patent Laid-Open No. 219823/1997 and there is published a view of a single pixel, that is, a view arranged with a single piece of irradiation window at a side of a light receiving portion. In this way, also in a close contact type area sensor, a single piece of pixel is arranged with only a single piece of irradiation window.

Next, a description will be given of a case of reading a reading object by color. When a color image is intended to read, a special method needs to use. Color formation methods are grossly classified into three types of (a) light source switching type, (b) filter switching type and (c) type for using color image sensor. According to (a) light source switching type, three colors of light sources (fluorescent lamp, LED etc.) are successively winked and image information of draft is successively read by monochromatic image sensors to thereby provide signal outputs of red, green and blue. According to (b) filter switching type, there are provided color filters of red, green and blue between a while color light source and monochromatic image sensors. Further, image information is successively read by switching the filters to thereby provide signal outputs of red, green and blue. According to (c) color image sensor type, color disintegration and reading are simultaneously carried out by a color image sensor integrated with three line image sensors and color filters in one package.

Next, a description will be given of a sensor portion for carrying out photoelectric conversion. Normally, light is converted into electricity by using a PN type photodiode. Otherwise, there is a PIN type diode, an avalanche type diode, an npn embedded type diode, a schottky type diode or a phototransistor. Other than these, there are a photoconductor for X-ray and a sensor for infrared ray. Concerning these, there is a description in "A Basis of a Solid Image Taking Element—a Mechanism of an Electronic Eye" written by Takao Ando, Hirohito Komobuchi: Nippon Ricoh Suppan Kai.

According to the conventional irradiation window 307, a single piece thereof is arranged for one pixel. Therefore, the light utilizing efficiency is not high, as a result, the signal is also weak. Further, since light irradiated also to portions other than the irradiation window 307, the light utilizing efficiency is not high and more power consumption is needed. Further, depending on a light source, light is not irradiated to a total of the irradiation window 307 and therefore, the light utilizing efficiency is not high and more power consumption is needed.

Here, in order to describe the light utilizing efficiency, firstly, a description will be given of Lambert's cosine law. Lambert's cosine law describes a reflection characteristic of light at a diffusing face. A diffusing face following Lambert's cosine law is referred to as a completely diffusing face and diffused light thereof is referred to as completely diffused light. Normal paper is near to a completely diffusing face and may approximately be regarded as a completely diffusing face with no problem.

Suppose that as shown by FIG. 6, incident light 601 is incident on a reflecting face 603 from an arbitrary direction. Then, when the reflecting face 603 is a completely diffusing face, the incident light is diffused and reflected in all of directions. A description will be given of an intensity of reflected light 602 at this occasion. First, an intensity of light reflected in a direction perpendicular to the reflecting face 603, that is, in a direction of a normal line or a perpendicular line, is designated by notation $I_0$. And an angle made by the normal line of the reflecting face 603 and reflected light is defined as a reflection angle. An optical intensity $I(\theta)$ having a reflection angle of θ is given by $I(θ)=I_0 * \cos θ$. The optical intensity is not dependent on an angle of incidence of incident light. In this way, Lambert's cosine law states that the optical intensity of reflected light is the optical intensity $I_0$ multiplied by cosine of the reflection angle.

Further, the light intensity described here is an intensity of light energy, that is, luminous intensity or luminous flux. When considered in term of brightness, in the case of complete diffusion, the brightness remains unchanged by an angle of viewing the reflecting face 603.

In this way, according to a completely diffusing face, regardless of an incident angle of incident light, reflected light is reflected in all of directions and reflected light in a direction of a normal line (perpendicular line) of the face is provided with the strongest optical intensity. Further, as the reflection angle is increased, the intensity of the reflected light is weakened. Normal paper may be regarded as a completely diffusing face as an approximation with excellent accuracy.

Based on Lambert's cosine law as mentioned above, a consideration will be given of the light utilizing efficiency of a case in which a single piece of irradiating window is arranged. Here, for simplicity, a consideration will be given of a case in which an optical system is not arranged. Even when an optical system is arranged, similar consideration can be given thereto.

Suppose that as shown by FIG. 7, there is a single piece of pixel formed with the light receiving portion 306 and the irradiation window 307 at the glass 305, above the reading object 304 constituting a completely diffusing face. Suppose that the irradiated light is irradiated from above. The irradiated light transmits through the irradiation window 307 and reaches the reading object 304.

First, when light is incident from the irradiation window 307 at a vicinity of the light receiving portion 306, reflected light from the reading object 304 is easy to be incident on the light receiving portion 306. Further, a reflection angle of the reflected light at the reading object 304 is small and therefore, an optical intensity thereof is strong as is known from Lambert's cosine law. That is, a large amount of light reflected by the reading object 304 is incident on the light receiving portion 306 and therefore, the light utilizing efficiency is high.

Meanwhile, when light is incident from the irradiation window 307 remote from the light receiving portion 306, reflected light from the reading object 304 hardly enters the light receiving portion and is transmitted again to the irradiation window 307. That is, the reflected light is wasted. Only light having a large reflection angle is incident on the light receiving portion. However, light having the large reflection light is provided with a small optical intensity as is known from Lambert's cosine law. Therefore, a large amount of light is not incident on the light receiving portion 306 and the light utilizing efficiency is low.

Next, a consideration will be given of a positional dependency of a light receiving rate of the light receiving portion 306.

First, reflected light from the reading object 304 is easy to be incident on the light receiving portion 306 at a vicinity of the irradiation window 307. Further, the optical intensity is also high since the reflection angle is small. That is, the light receiving rate is high at the light receiving portion 306 at a vicinity of the irradiation window 307.

Meanwhile, reflected light from the reading object 304 is difficult to be incident on the light receiving portion 306 remote from the irradiation window 307. Further, even when the reflected light is incident on the light receiving portion 306, the optical intensity is low since the reflection angle is large as is known from Lambert's cosine law. That is, the light receiving rate is low at the light receiving portion 306 remote from the irradiation window 307.

The above-described is summarized as follows. That is, even when single pieces of the large light receiving portion 306 and the large irradiation window 307 are arranged, light is utilized actually effectively only at a vicinity of a boundary between the light receiving portion 306 and the irradiation window 307. Therefore, even when the light receiving portion 306 is arranged at a location remote from the irradiation window 307, light is wasted. Further, even when the irradiation window 307 is arranged at a location remote from the light receiving portion 306, light is not utilized effectively. That is, when single pieces of the large light receiving portion 306 and the large irradiation window 307 are arranged, the light utilizing efficiency is very poor. When reflected light from the reading object 304 is not so much incident on the light receiving portion 306, a signal of the light receiving portion 306 is also weakened. As a result, a characteristic of the sensor such as sensitivity is deteriorated.

Next, a consideration will be given of a portion of light emitted from the light source 303 which is incident on the rear face of the glass 305 and transmits through the irradiation window 307. When light emitted from the light source 303 is irradiated to an entire face of the glass 305, light is irradiated also to a portion other than the irradiation window 307. A consideration will be given of the light utilizing efficiency in that case.

As shown by FIG. 7, light is irradiated to the irradiation window 307 from a side opposed to the reading object 304. Further, the irradiated light transmits through the irradiation window 307 and is irradiated to the reading object 304. The light is reflected by the reading object 304 and is incident on the light receiving portion 306. In the above-described procedure when light is irradiated to an entire face of the glass 305 from the side opposed to the reading object 304 in the direction of the irradiation window 307, light is irradiated also to the light receiving portion 306 and a sensor circuit portion such as other circuit portion (normally, a light shielding film is formed at portions other than the irradiation window 307, for example, between the light receiving portion 306 or the circuit portion and the glass 305 and only light reflected by the reading object 304 is incident on the light receiving portion 306). However, only light irradiated to the irradiation window 307 is actually utilized. That is, light irradiated to the sensor circuit portion is totally wasted. As a result, the light utilizing efficiency is lowered. Therefore, an increase in power consumption is caused for irradiating stronger light to the reading object 304.

Further, in the case in which light emitted from the light source 303 is irradiated only to a portion of the face, when positions of the region and the irradiation window 307 are shifted from each other, there is produced a region in which light is not incident on the irradiation window 307. That is, an amount of light which transmits through the irradiation window 307 and is irradiated to the reading object 304 is reduced. As a result, the light utilizing efficiency is lowered. Therefore, an increase in power consumption is caused for irradiating stronger light to the reading object 304.

SUMMARY OF THE INVENTION

It is an object of the present invention to resolve the above-described problem of the conventional technology.

Further specifically, it is a problem of the present invention to provide a close contact type sensor having high light utilizing efficiency.

First, a plurality of irradiation windows are provided to one pixel. According to an irradiation window, only an irradiation window at a vicinity of a light receiving portion constitutes a region in which light is effectively utilized. Further, according to a light receiving portion, only a light receiving portion at a vicinity of an irradiation window constitutes a region on which light is easy to be incident. That is, light is effectively utilized only at regions of portions of a light receiving portion and an irradiation window at a vicinity of a boundary therebetween.

In a single pixel, by providing a large number of irradiation windows by reducing a size of a single irradiation window, regions of portions of a light receiving portion and an irradiation window at a vicinity of a boundary therebetween can be increased. Further, a region of an irradiation window remote from a light receiving portion and a region of a light receiving portion remote from an irradiation window are reduced. Therefore, the light utilizing efficiency is promoted. As a result, a magnitude of an output signal from a pixel of a sensor is increased. Therefore, image quality read by a sensor is promoted. Further, power consumption of a light source can be reduced since the light utilizing efficiency is high.

Next, when light is irradiated from a side opposed to a reading object to an irradiation window, light is made to irradiate to only an irradiation window portion as much as possible and light is prevented from irradiating to a sensor circuit portion as less as possible. Or, the irradiation window portion is made to arrange at a region irradiated with light. As a result, light which does not reach the reading object, that is, wasteful light is reduced and the light utilizing efficiency is promoted. Further, power consumption of a light source can be reduced since the light utilizing efficiency is high.

Further, when light is irradiated from a side opposed to a reading object to an irradiation window, it is not necessarily needed to simultaneously carry out irradiation of light to an irradiation window portion as much as possible, arrangement of the irradiation window portion to a region irradiated with light and provision of a plurality of irradiation windows to a single pixel. These may be carried out respectively individually or may be carried out simultaneously.

Constitutions of the present invention will be shown as follows.

According to an aspect of the present invention, there is provided a close contact type sensor arranged with a plurality of unit pixels each comprising a sensor circuit portion and a plurality of irradiation window portions.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

an optical fiber plate between the sensor circuit portion and a reading object;

wherein an area of any of the plurality of irradiation window portions is larger than an area of a half of a section of a single piece of an optical fiber in the optical fiber plate.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display; and
a backlight;

wherein the liquid crystal display is arranged below the backlight, the sensor circuit portion and the plurality of irradiation window portions are arranged below the liquid crystal display and the plurality of irradiation window portions are arranged on inner sides of opening portions of the liquid crystal display.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display;
a backlight; and
an optical fiber plate;

wherein the liquid crystal display is arranged below the backlight, the sensor circuit portion and the plurality of irradiation window portions are arranged below the liquid crystal display, the optical fiber plate is arranged below the sensor circuit portion and the plurality of irradiation window portions and the plurality of irradiation window portions are arranged on inner sides of opening portions of the liquid crystal display.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display; and
a backlight;

wherein in the liquid crystal display, a single piece of a unit pixel is constituted by one pixel for red, one pixel for green and one pixel for blue, the liquid crystal display is arranged below the backlight, the sensor circuit portion and the plurality of irradiation window portions are arranged below the liquid crystal display and a size of the unit pixel of the liquid crystal display is a size of the unit pixel of the close contact type sensor multiplied by an integer or a factor (fraction) of an integer thereof.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display;
a backlight; and
an optical fiber plate;

wherein in the liquid crystal display, a single piece of a unit pixel is constituted by one pixel for red, one pixel for green and one pixel for blue, the liquid crystal display is arranged blow the backlight, the sensor circuit portion and the plurality of irradiation window portions are arranged below the liquid crystal display, the optical fiber plate is arranged below the sensor circuit portion and the plurality of irradiation window portions and a size of the unit pixel of the liquid crystal display is a size of the unit pixel of the close contact type sensor multiplied by an integer or a factor of an integer thereof.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display; and a backlight;

wherein in the liquid crystal display, a single piece of a unit pixel is constituted by one pixel for red, one pixel for green and one pixel for blue, the liquid crystal display is arranged blow the backlight, the sensor circuit portion and the plurality of irradiation window portions are arranged below the liquid crystal display, and light of the backlight successively transmits through the pixel for red, the pixel for green and the pixel for blue of the liquid crystal display at every respective subframe period.

According to another aspect of the present invention, there is provided a close contact type sensor which is a close contact type sensor arranged with a plurality of unit pixels each comprising a sensor circuit portion and a plurality of irradiation window portions, the close contact type sensor comprising:

a liquid crystal display;

a backlight; and an optical fiber plate;

wherein in the liquid crystal display, a single piece of a unit pixel is constituted by one pixel for red, one pixel for green and one pixel for blue, the liquid crystal display is arranged blow the backlight, the sensor circuit portion and the plurality of irradiation window portions are arranged below the liquid crystal display, the optical fiber plate is arranged below the sensor circuit portion and the plurality of irradiation window portions and light of the backlight successively transmits through the pixel for red, the pixel for green and the pixel for blue of the liquid crystal display at every subframe period.

BRIEF DESCRIPTION OF THE DRAWINGS

FIG. 2 is a sectional view of a scanner using a conventional close contact type optical system;

FIG. 3 is a sectional view of a conventional completely close contact type sensor;

FIGS. 5A and 5B are views showing constitutions of conventional completely close contact type sensors.

FIG. 24 is a timing chart of an area sensor according to the invention;

FIG. 25 is a timing chart of an area sensor according to the invention;

FIGS. 26A, 26B, 26C and 26D are views showing steps of fabricating an image sensor according to the invention;

FIGS. 28A, 28B and 28C are views showing steps of fabricating an image sensor according to the invention;

FIGS. 30A and 30B are views of an electronic apparatus using an image sensor according to the invention;

DETAILED DESCRIPTION OF THE PREFERRED EMBODIMENTS

Embodiment 1

Figure 8:
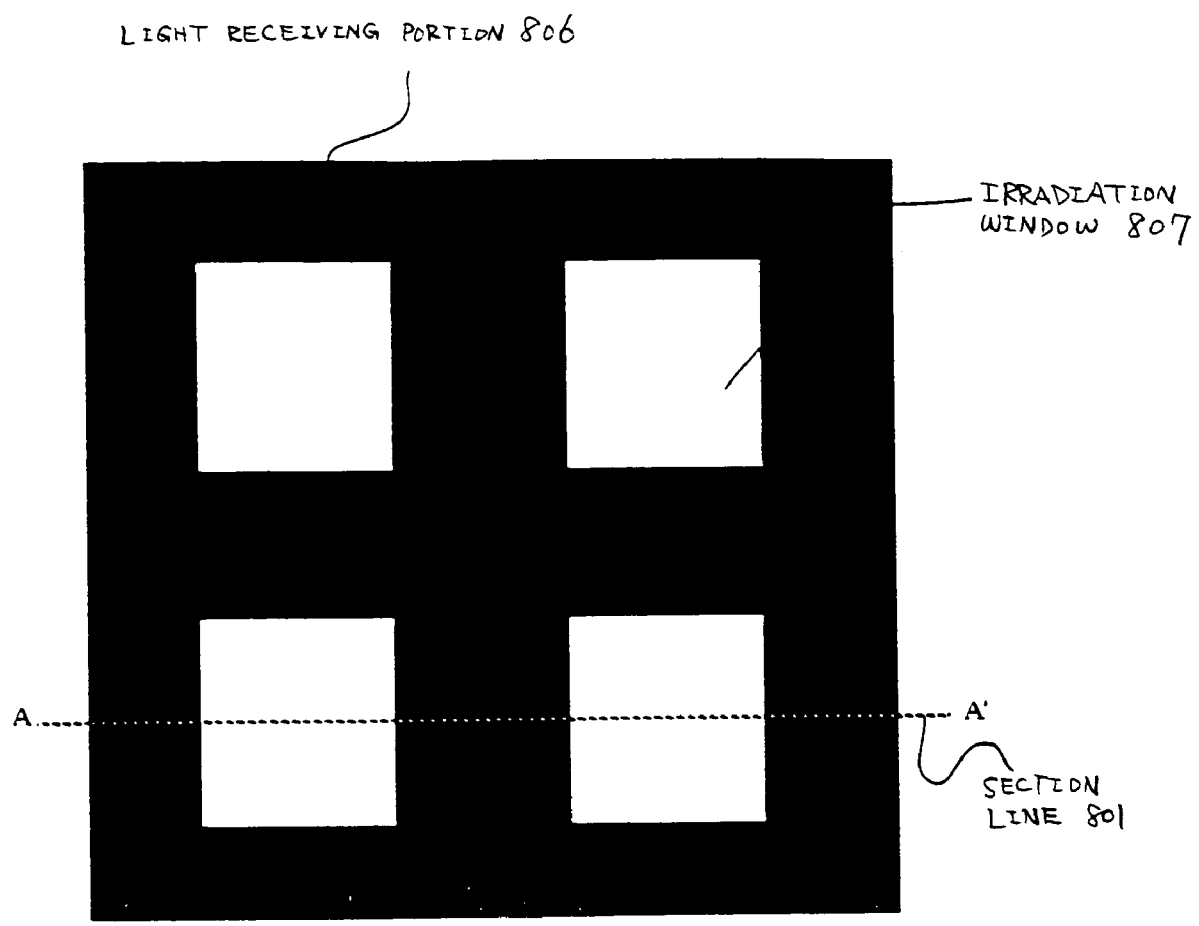
FIG. 8 is a view showing an irradiation window of a completely close contact type sensor according to the invention.
Figure 9:
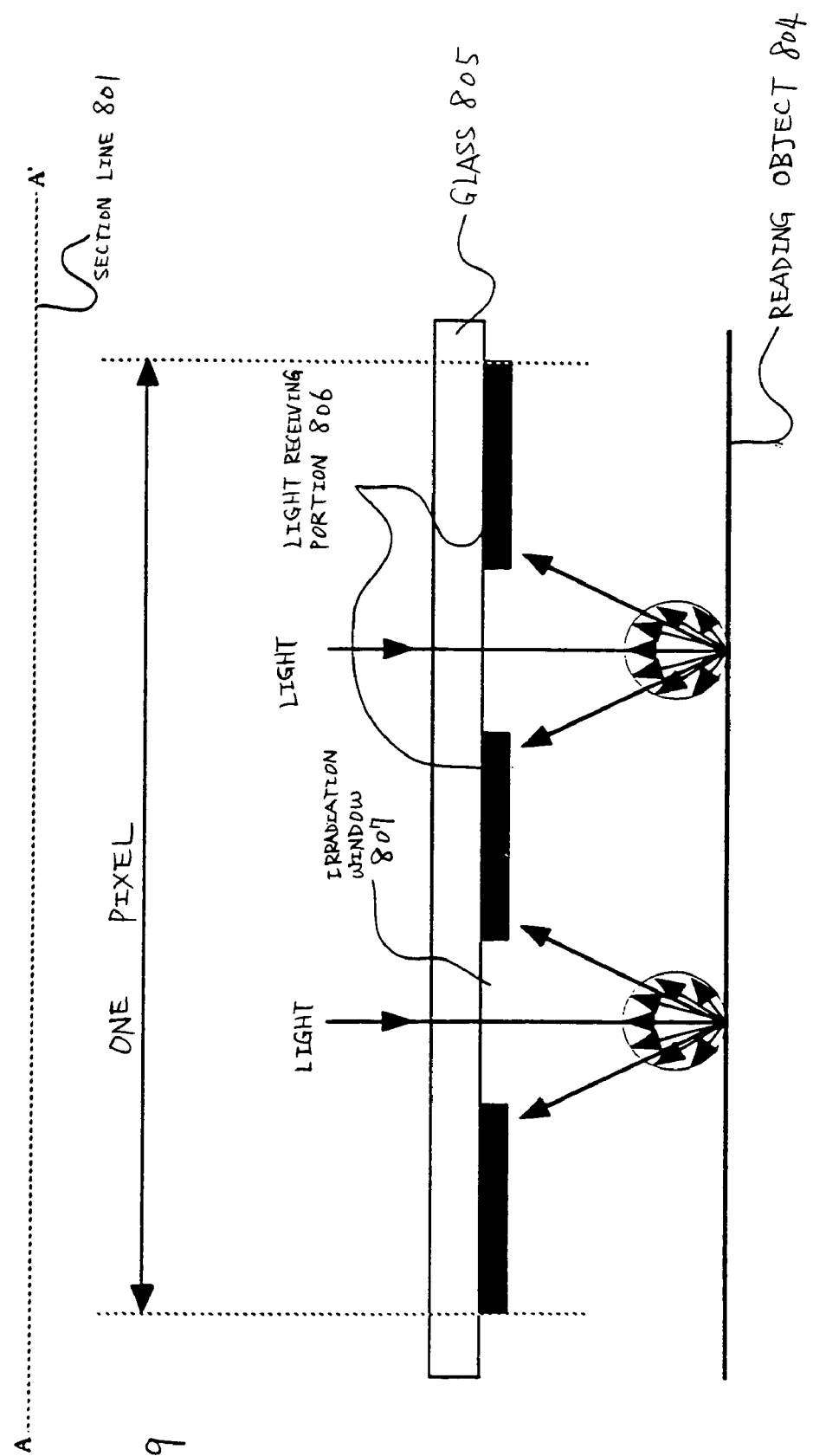
FIG. 9 is a sectional view of a completely close contact type sensor according to the invention.

FIG. 8 shows a view viewing, from above, a case in which a plurality of irradiation windows 807 are provided in a single pixel. FIG. 9 shows a sectional view of FIG. 8 taken along a section line 801. The number of the irradiation windows 807 may be any number so far as the number is a plural number. Glass 805 is formed with light receiving portions 806, circuit portions and the irradiation windows 807. The irradiation window 807 is made to be transparent for transmitting light. According to the light receiving portion 806, a light shielding film is frequently formed between the light receiving portion 806 and the glass 806 such that influence is not effected thereon even when light is incident thereon from a side opposed to a reading object 804. Further, the light receiving portion 806 and the circuit portion may be arranged to overlap.

Further, although in FIG. 9, for simplicity, only the light receiving portions 806 and the irradiation windows 807 are illustrated on the glass 805, actually, circuit portions or light shielding films may be formed thereon.

Further, although in FIG. 9, for simplicity, nothing is illustrated between the light receiving portion 806 and the reading object 804, actually, an optical system, a protective film or a glass may be arranged therebetween. As an optical system, an optical fiber plate may be used or a rod lens array may be used.

Further, in FIG. 9, light is irradiated from a glass face which is not formed with the light receiving portion. However, the light receiving portion 806, the glass 805 formed with the light receiving portion and the reading object 804 may be arranged in this order by turning the glass 805 upside down.

By arranging the plurality of irradiation windows 807 to a single pixel in this way, regions of portions of the light receiving portion and the irradiation window at a vicinity of a boundary therebetween can be increased. As a result, light can effectively be utilized. Therefore, a magnitude of an output signal from a pixel of a sensor is increased and quality of image read by the sensor is promoted. Further, power consumption of a light source can be reduced since the light utilizing efficiency is high.

Embodiment 2

Figure 1:
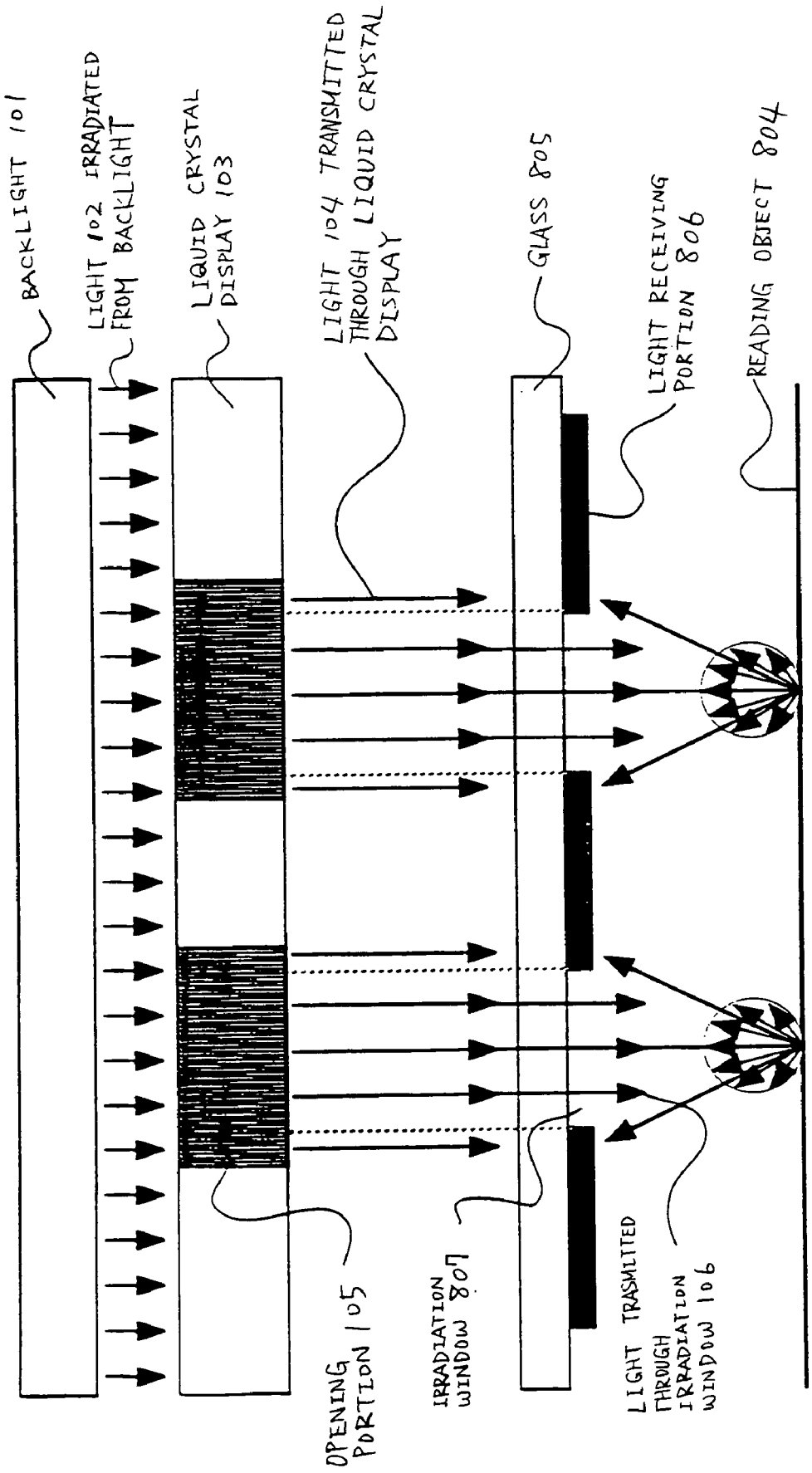
FIG. 1 is a sectional view of a completely close contact type sensor according to the invention.
Figure 4A:
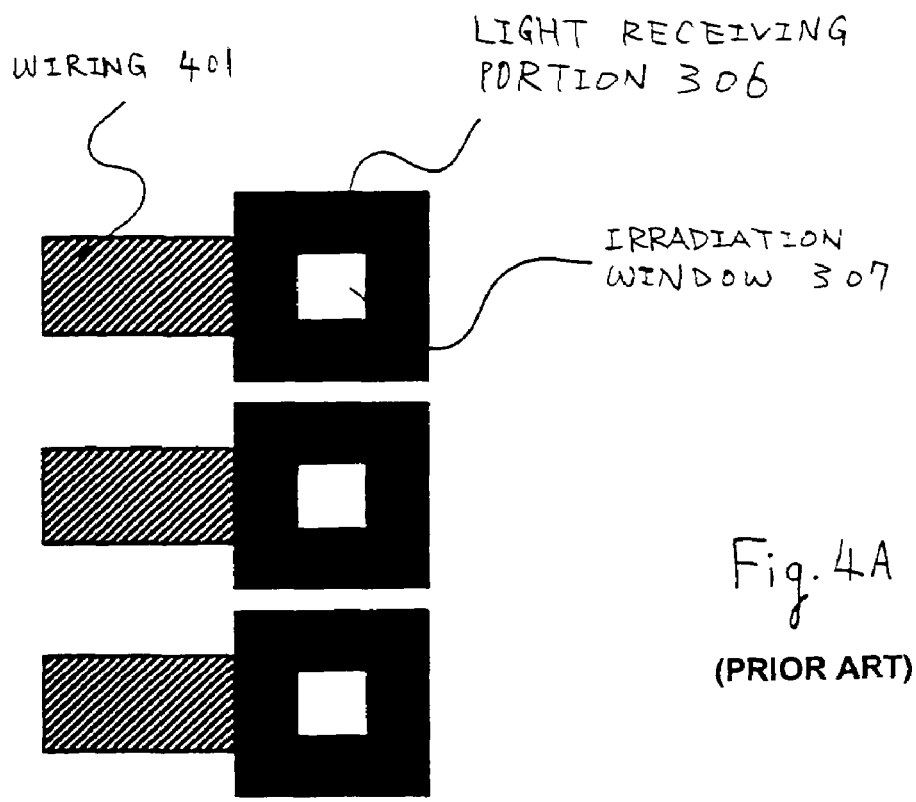
FIGS. 4A and 4B are views showing irradiation windows of conventional completely close contact type sensors.
Figure 4B:
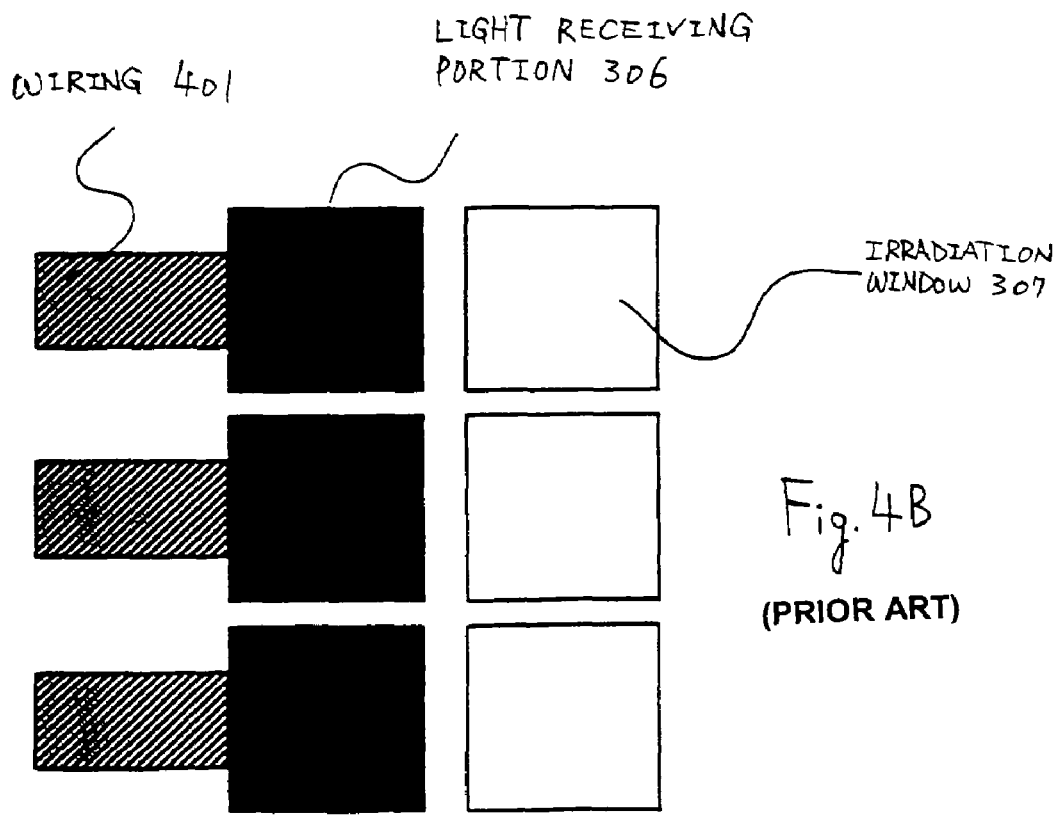
Figure 6:
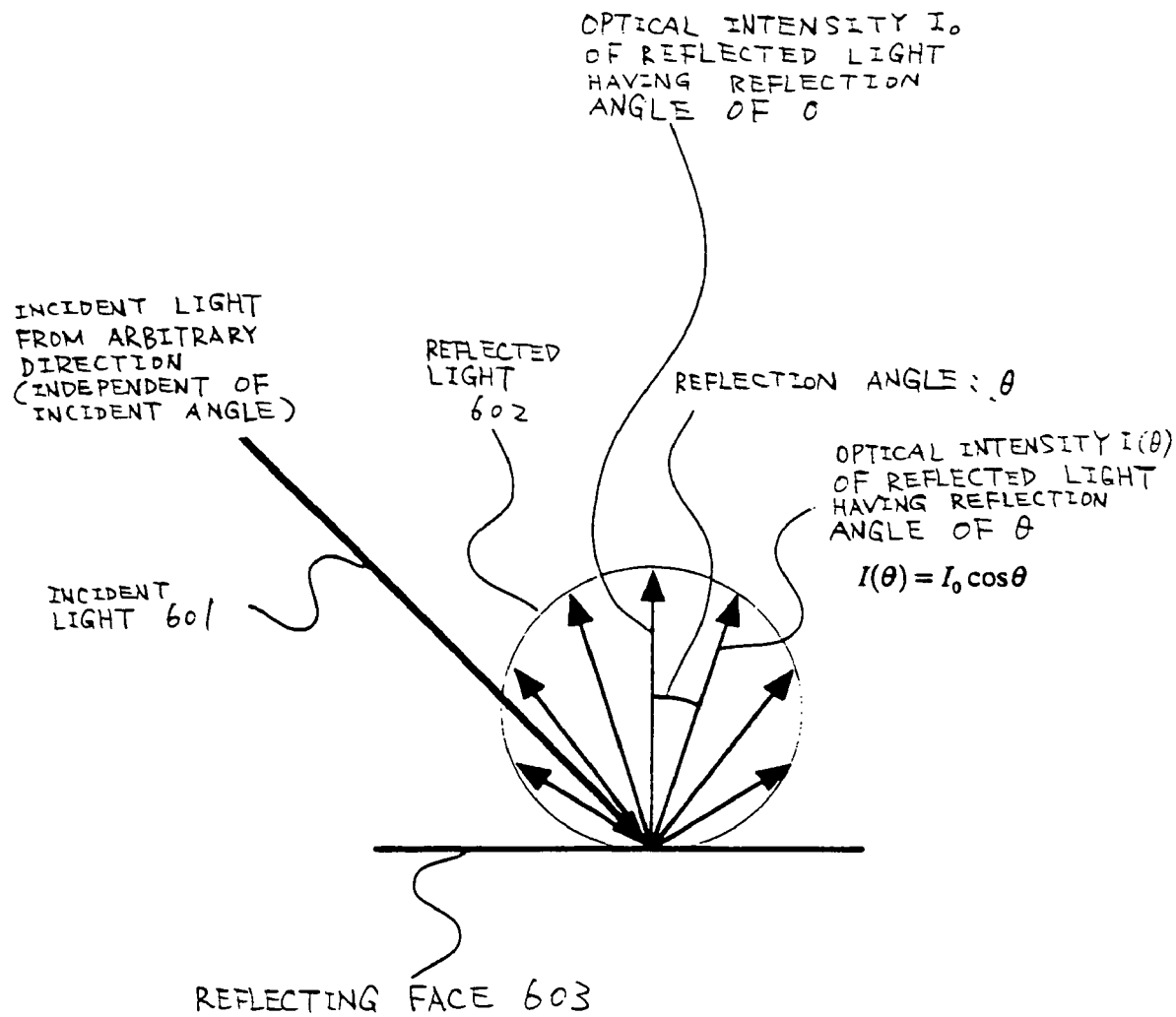
FIG. 6 is a view showing Lambert's cosine law.
Figure 7:
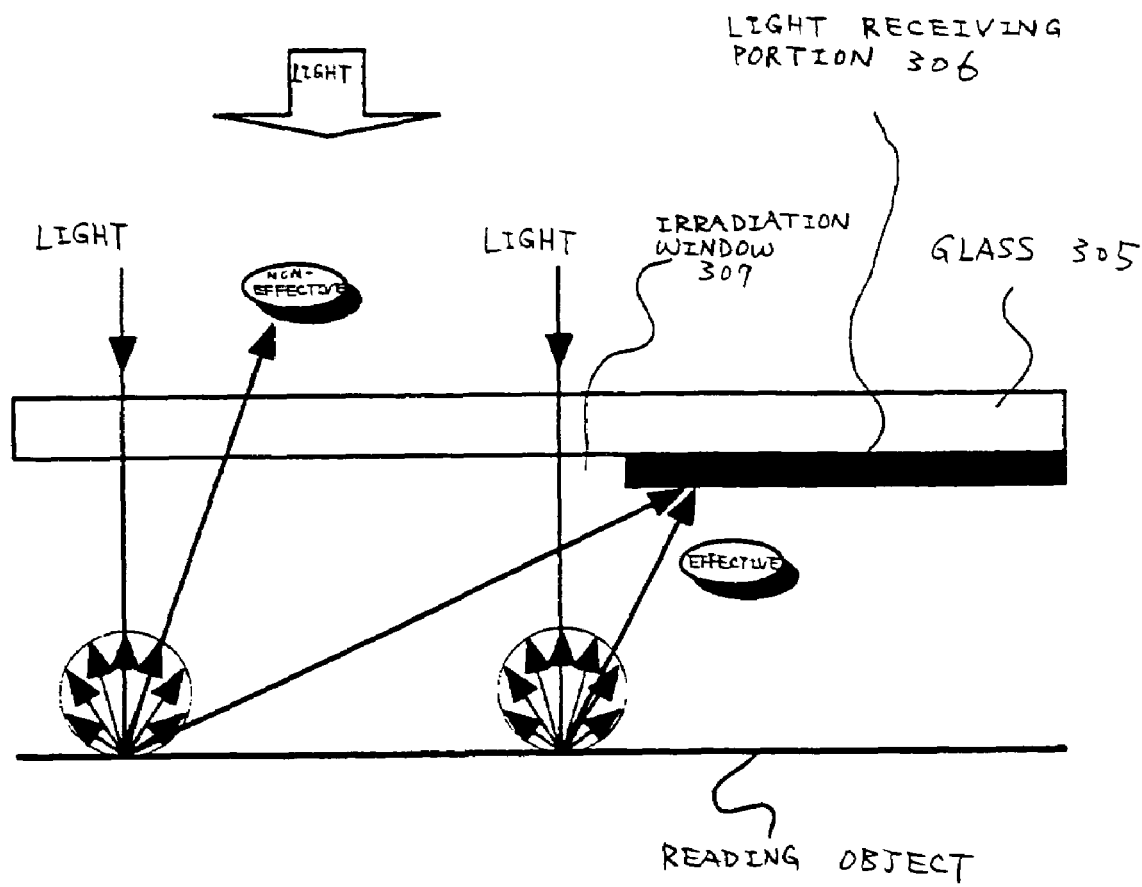
FIG. 7 is a sectional view of a conventional completely close contact type sensor.

FIG. 1 shows a sectional view of a close contact type sensor when a liquid crystal display and a backlight are used as a light source for a sensor. A backlight 101 is provided at the topmost position, a liquid crystal display 103 is provided therebelow, the light receiving portions 806 and the irradiation windows 807 are provided therebelow and the reading object 804 are provided therebelow.

The glass 805 is formed with the light receiving portions 806, circuit portions and the irradiation windows 807. The irradiation window 807 is made to be transparent for transmitting light. According to the light receiving portion 806, a light shielding film is frequently formed between the light receiving portion 806 and the glass 805 such that influence is not effected thereto even when light is incident from a side opposed to the reading object 804. Further, the light receiving portion 806 and the circuit portion may be arranged to overlap.

Further, although in FIG. 1, for simplicity, only the light receiving portions 106 and the irradiation windows 807 are illustrated on the glass 805, actually, circuit portions or light shielding films may be formed thereon.

Further, although in FIG. 1, for simplicity, nothing is illustrated between the light receiving portion 806 and the reading object 804, actually, an optical system, a protective film or glass may be arranged therebetween. As an optical system, an optical fiber plate may be used or a rod lens array may be used.

Further, in FIG. 1, light is irradiated from a glass face which is not formed with the light receiving portions. However, the light receiving portions 806, the glass 805 formed with the light receiving portions and the reading object 804 may be arranged in this order by turning the glass 805 upside down.

The operation is as follows. First, light 102 is irradiated to a side of the liquid crystal display 103. At the liquid crystal display 103, there are present regions which can transmit the light 102, that is, opening portions 105. The light 102 cannot transmit through regions other than the opening portions 105. Light 104 which has transmitted through the opening portions 105 of the liquid crystal display 103 is irradiated to sides of the light receiving portions 806 and the irradiation windows 807. That is, the light is not irradiated to the sides of the light receiving portions 806 and the irradiation windows 807 over entire faces thereof but only the light 104 which has transmitted through the opening portions 105 is irradiated to the sides of the light receiving portions 806 and the irradiation windows 807.

Meanwhile, on the side of the light receiving portion 806, reflected light of light irradiated to the reading object 804 is read by the light receiving portion 806. The irradiation windows 807 are provided for irradiating light to the reading object 804. That is, only light irradiated to portions of the irradiation windows 807 constitutes light 106 transmitting through the irradiation windows. Even when light is irradiated from the liquid crystal display 103 to a location other than the irradiation window 807, the light is wasted.

Hence, in order to effectively utilize light, with respect to the opening portion 105 and the irradiation window 807, positions, sizes or shapes of the both members are matched. That is, a large amount of the light 104 which has transmitted through the liquid crystal display is made to be the light 106 for passing through the irradiation window by completely overlapping the irradiation window 807 and a portion of the opening portion 105. As a result, the light utilizing efficiency is promoted.

Figure 10:
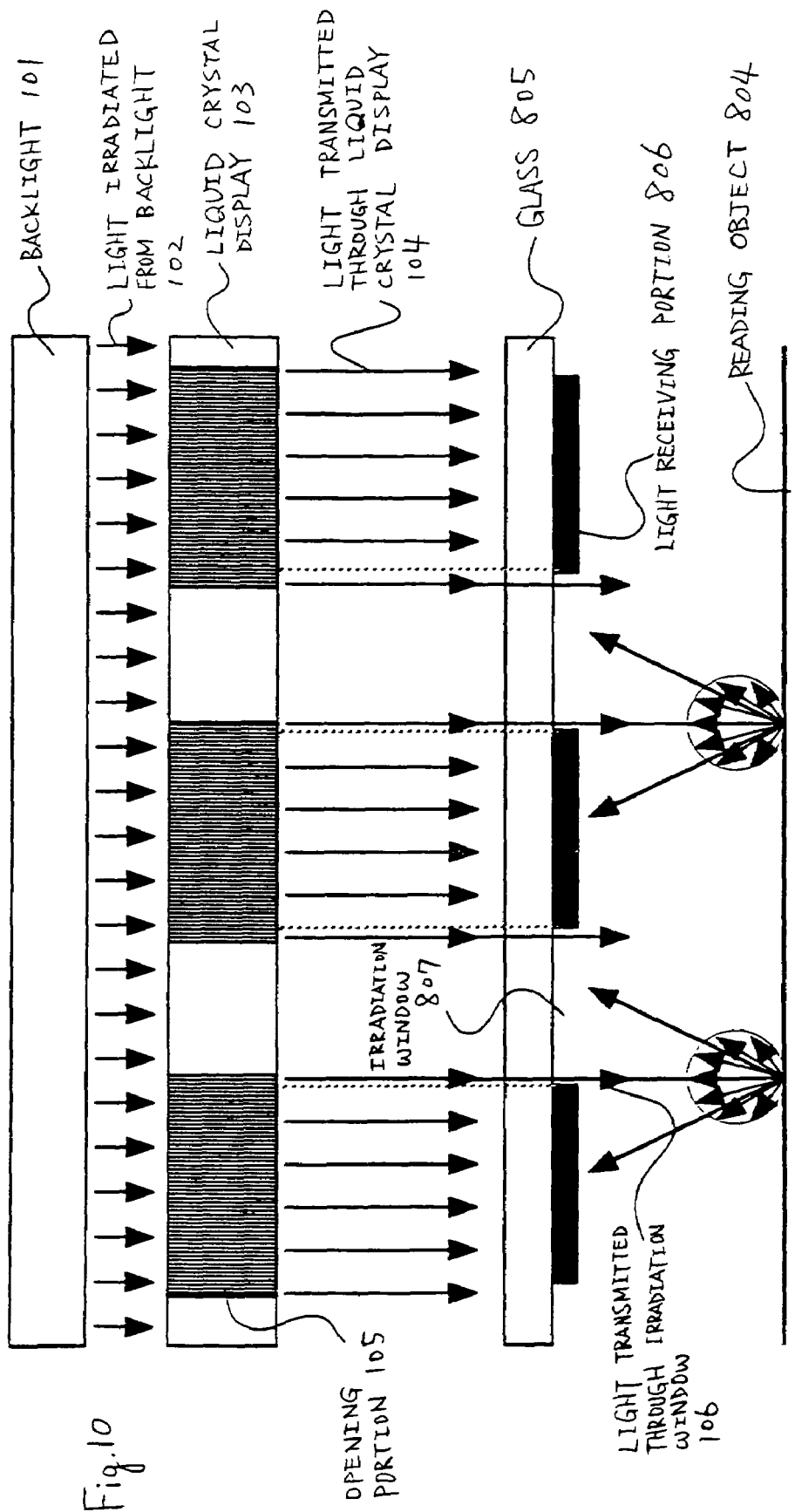
FIG. 10 is a sectional view of a conventional completely close contact type sensor.

When with respect to the opening portion 105 and the irradiation window 807, the positions or the sizes or the shapes are deviated from each other, as shown by FIG. 10, a large amount of light irradiated to the portion of the irradiation window 807 is wasted and the light 106 for passing through the irradiation window 106 is reduced.

Further, Embodiment 1 and Embodiment 2 can freely be combined.

EXAMPLES

Example 1

Figure 11:
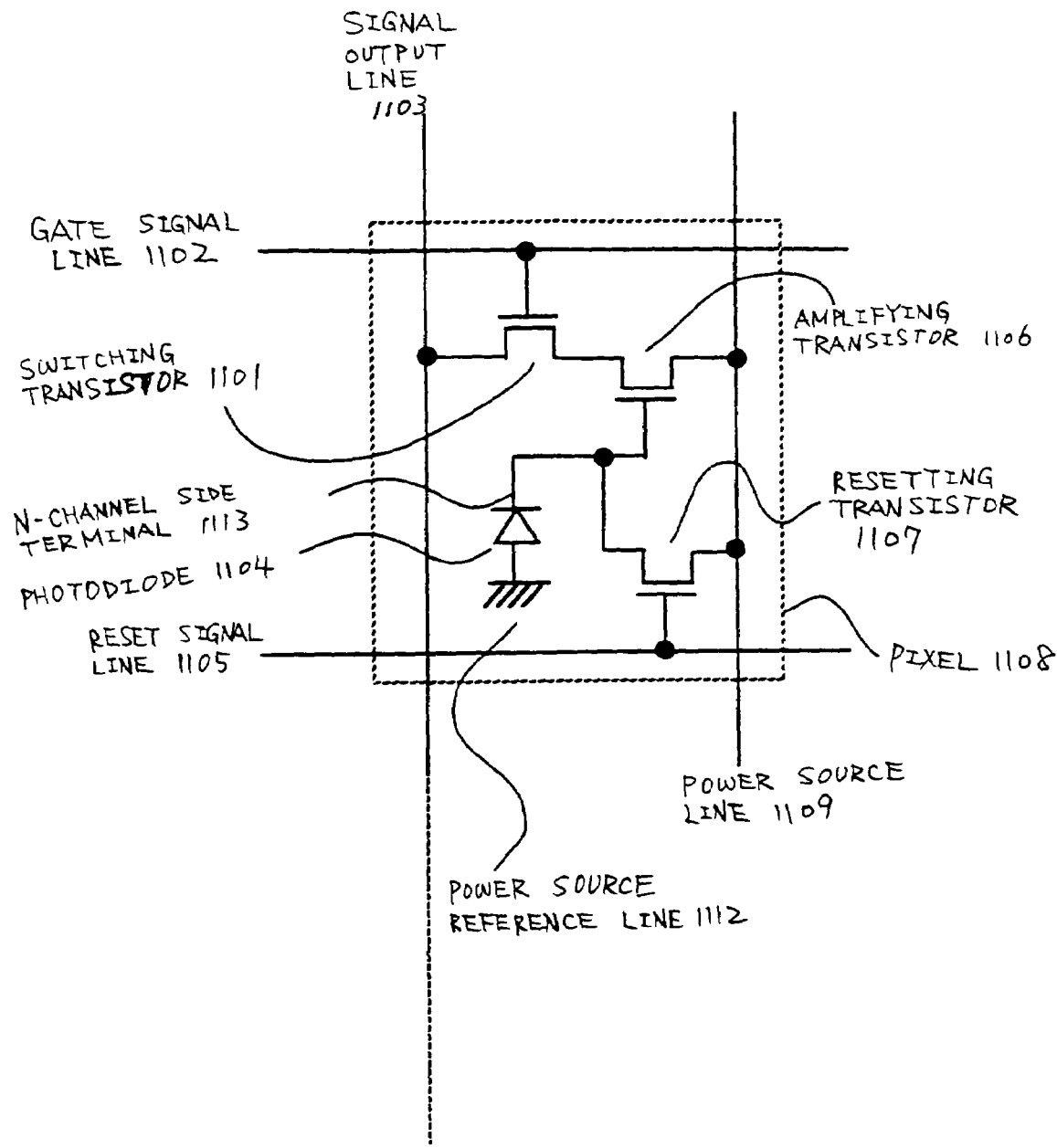
FIG. 11 is a circuit diagram of a circuit of a pixel according to the invention.

Next, a description will be given of an example when a plurality of irradiation windows are provided to a single pixel. FIG. 11 shows a circuit diagram of a pixel. In FIG. 11, there is used a photodiode 1104 as a photoelectric conversion element which is an active type sensor. A P-channel side terminal of the photodiode 1104 is connected to a power source reference line 1112 and an N-channel side terminal 1113 thereof is connected to a gate terminal of an amplifying transistor 1106. A drain terminal and a source terminal of the amplifying transistor 1106 are connected to a power source line 1109 and a drain terminal of a switching transistor 1101. A gate terminal of the switching transistor 1101 is connected with a gate signal line 1102 and a source terminal thereof is connected with a signal output line 1103. A gate terminal of a resetting transistor 1107 is connected to a reset signal line 1105. A source terminal and a drain terminal of the resetting transistor 1107 are connected to the power source line 1109 and the gate terminal of the amplifying transistor 1106.

Further, with regard to a sensor portion for carrying out photoelectric conversion, other than a normal PN type photodiode, a PIN type diode, an avalanche type diode, an npn embedded type diode, a Schottky type diode, a phototransistor, a photoconductor for X-ray or a sensor for infrared ray can also be used. Further, after converting X-ray into light by a fluorescent member or a sintilator, the light may be read.

Further, although in FIG. 11, there is provided the active type sensor mounted with the signal amplifying element, a passive type sensor which is not mounted with the signal amplifying element can also be used.

Figure 12A:
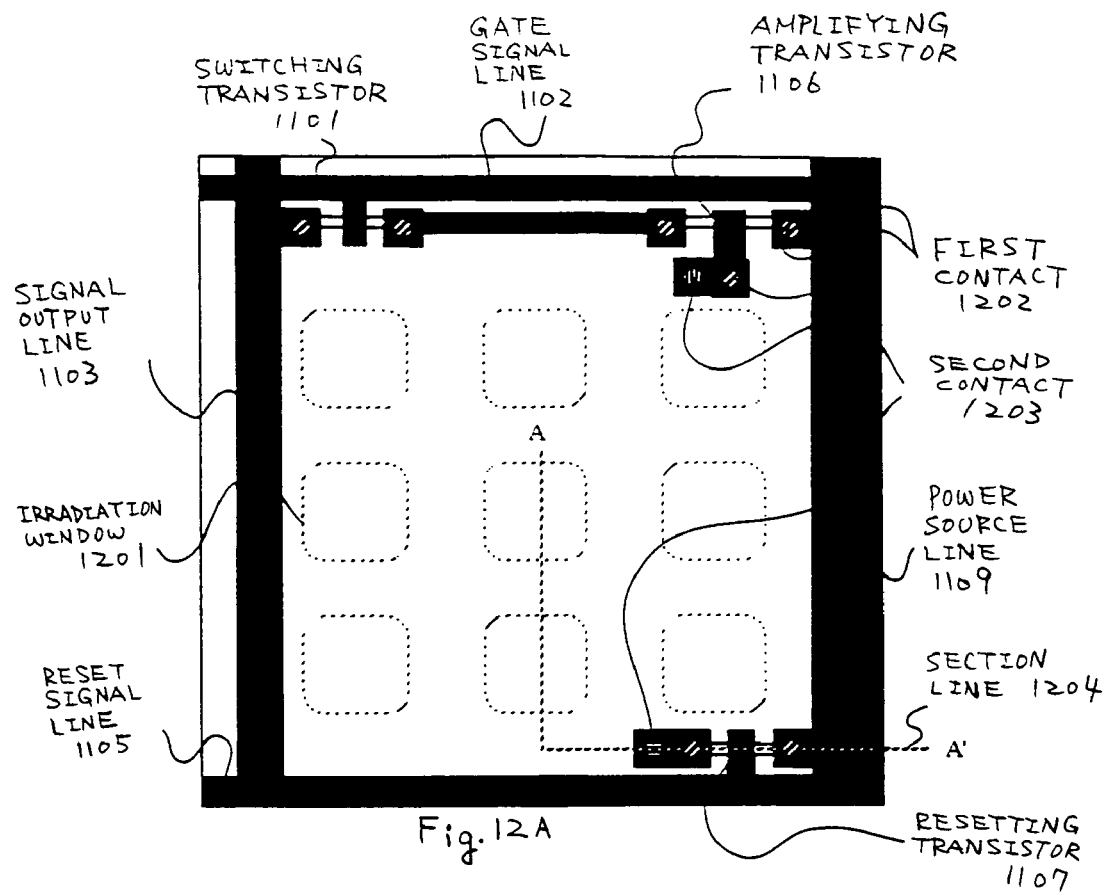
FIGS. 12A and 12B are layout views of a pixel according to the invention.
Figure 12B:
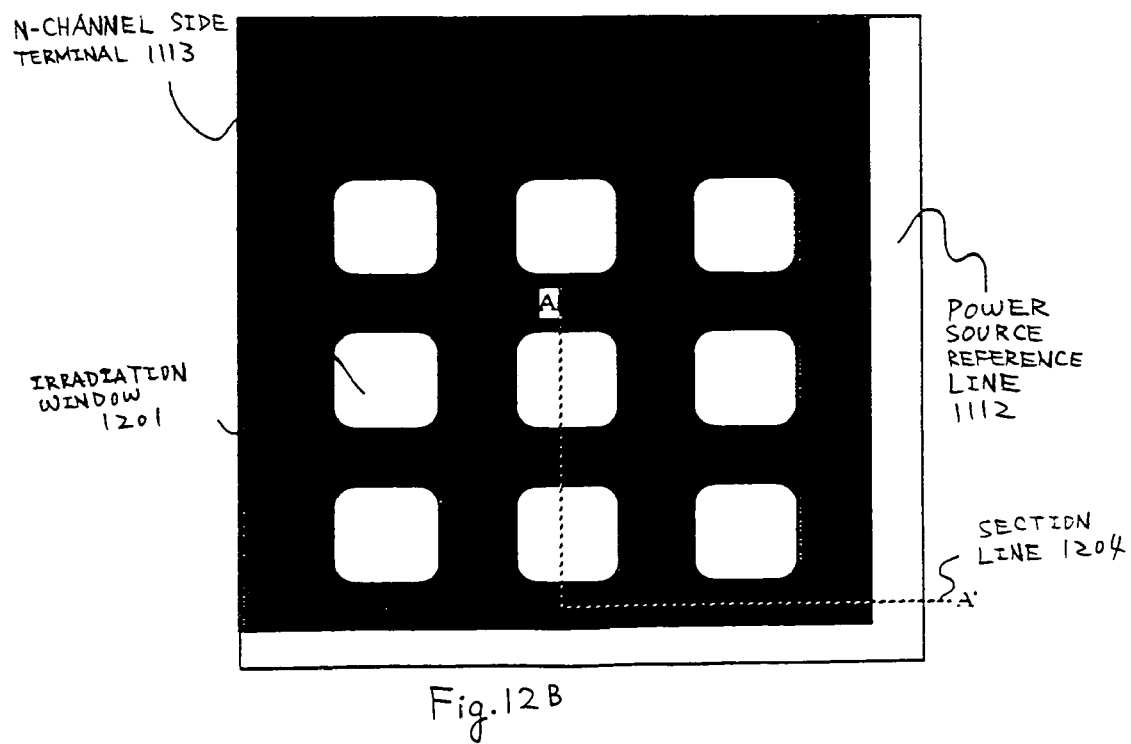
Figure 13:
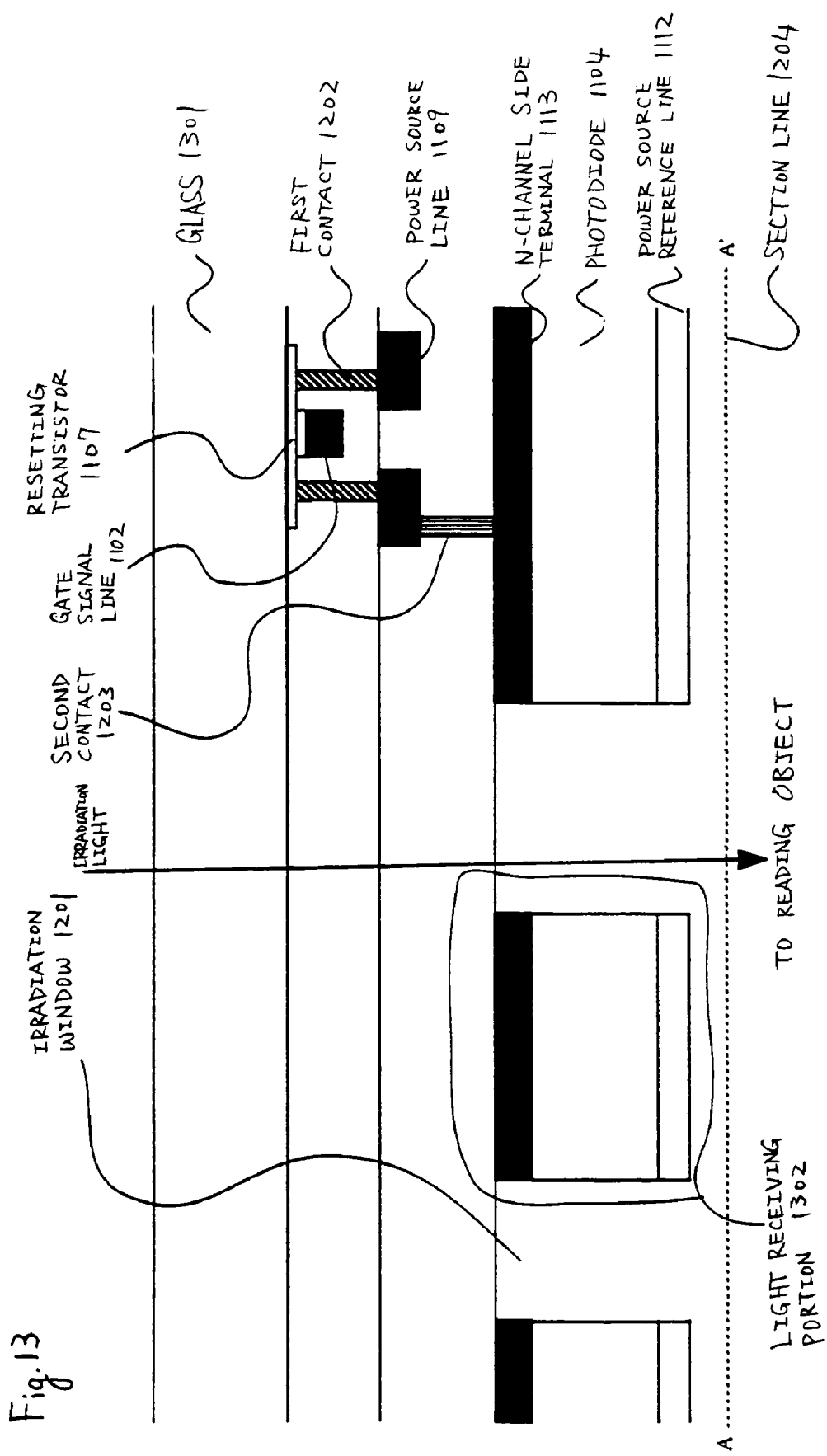
FIG. 13 is a sectional view of a pixel according to the invention.

FIGS. 12A and 12B show layout views realizing the circuit diagram of FIG. 11 and FIG. 13 shows a sectional view taken along a section line 1204. FIG. 12A is a layout view before the N-channel side terminal 1113 and FIG. 13B is a layout view after the N-channel side terminal 1113.

The gate signal line 1102, the reset signal line 1105 and the gate electrodes of the respective transistors are formed by using a first wiring. Wirings for connecting the signal output line 1103, the power source line 1109 and the transistors are formed by using a second wiring. The N-channel side terminal 1113 is formed by using a third wiring.

The N-channel side terminal 1113 is constituted by a material which is not transparent and accordingly, as apparent from FIGS. 12A and 12B, portions which are not covered by the N-channel side terminal 1113 and other wirings, constitute irradiation windows 1201. Portions which are covered by the wirings of the N-channel side terminal 1113 constitute light receiving portions. A circuit portion is arranged to overlap portions covered by wirings of the N-channel side terminal 1113. As is apparent from FIG. 13, irradiation light is incident from a rear face of glass 1301, transmits through the irradiation window 1201 and is irradiated to a side of a reading object. Light reflected by the reading object is incident on the photodiode 1104. A portion formed with the photodiode 1104 sandwiched between the N-channel side terminal 1113 and the power source reference line 1112, constitutes a light receiving portion 1302.

As shown by FIGS. 12A and 12B and FIG. 13, a plurality of the irradiation windows 1201 are arranged to one pixel and accordingly, regions of the light receiving portions 1302 and the irradiation window 1201 at the vicinities of boundaries therebetween are increased and the light utilizing efficiency is promoted.

Further, although in FIG. 13, for simplicity, nothing is illustrated between the photodiode 1104 and the reading object, actually, an optical system, a protective film or glass may be arranged therebetween. As an optical system, an optical fiber plate may be used and a rod lens array may be used.

Further, in FIG. 13, light is irradiated from a glass face which is not formed with a circuit such as a light receiving portion. However, light may be irradiated from a face formed with a circuit by turning the glass 1301 upside down. According to an arrangement at that occasion, circuits of the light receiving portion and the like (constituted by the N-channel side terminal 1113, the photodiode 1104, the power source reference line 1112, a second contact 1203, the power source line 1109, a first contact 1202, and the resetting transistor 1107 followed by the glass 1301), the glass 1301 and the reading object may be arranged in this order.

Example 2

Next, a description will be given of an embodiment when an optical fiber plate is arranged between a light receiving portion and a reading object as an optical system.

Figure 14:
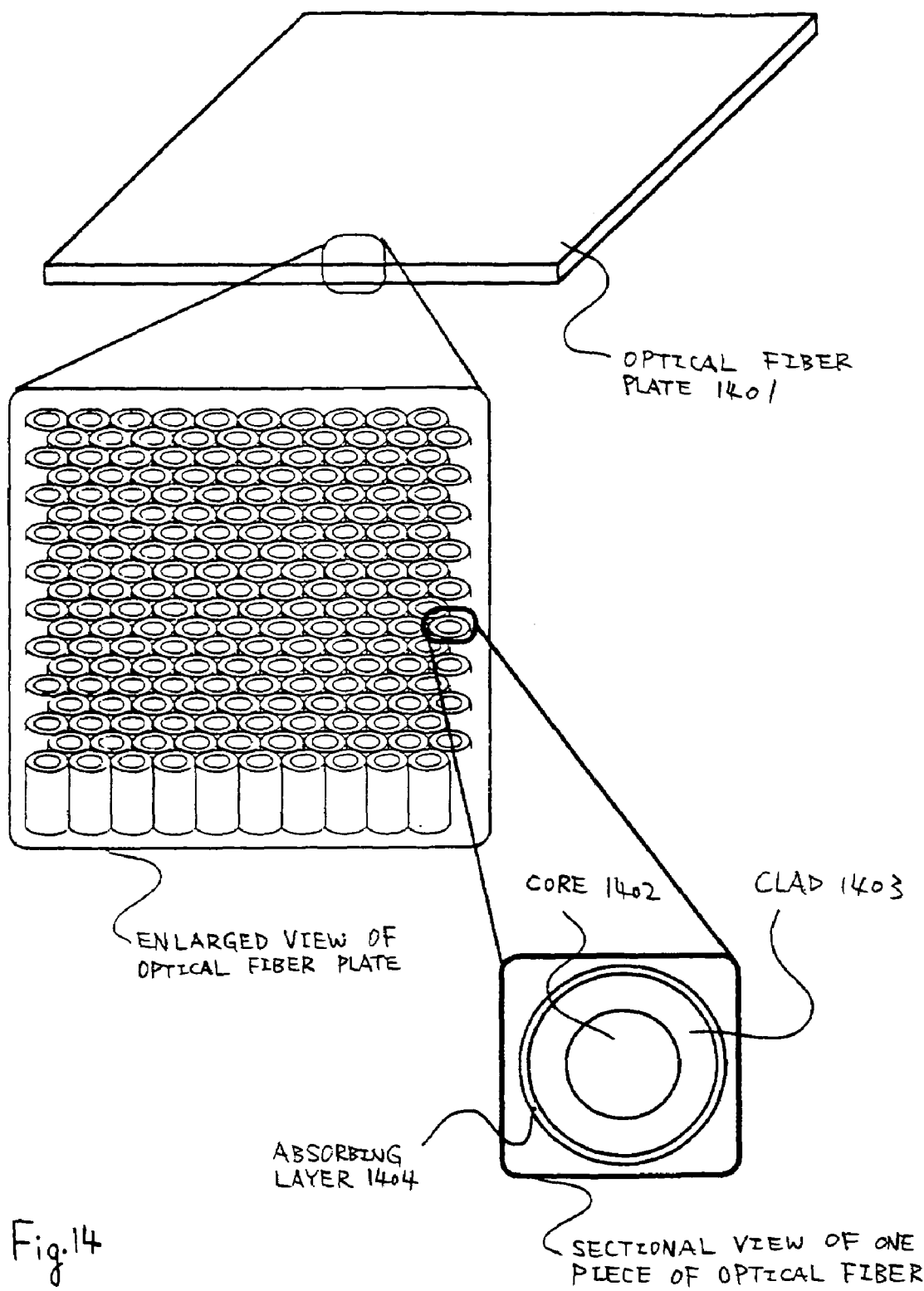
FIG. 14 is a view showing an optical fiber plate.

First, FIG. 14 shows an optical fiber plate, an enlarged view thereof and a sectional view of one piece of an optical fiber. An optical fiber plate 1401 is constituted by bundling a number of optical fibers and slicing the bundle in a shape of plate. One piece of the optical fiber is constituted by a core 1402 and a clad 1403. The core 1402 is disposed at the center of the optical fiber and is provided with higher refractive index. A surrounding of the core 1402 is covered with the clad 1403 and refractive index thereof is lower than that of the core 1402. As a result, light incident on a section of the optical fiber is propagated while being totally reflected in the core 1402. A surrounding of the clad 1403 is frequently provided with an absorbing layer 1404 for absorbing extra light.

The optical fiber plate 1401 per se is not provided with a function of focusing light. Light is only propagated at inside of the core 1402 of the respective piece of the optical fiber. When light is incident on a section of one piece of the optical fiber, light having a large angle of incidence is absorbed by the absorbing layer 1402 since the light cannot be totally reflected at inside of the core 1402. That is, light incident on the core 1402 of one piece of the optical fiber by a small angle of incidence, is propagated as it is and the other light, for example, light incident on the core 1402 by a large angle of incidence or light incident on the clad 1403 is not propagated. As a result, when the optical fiber plate 1401 is arranged between a light receiving portion and a reading object, an image read by a sensor can be prevented from being blurred.

Figure 15:
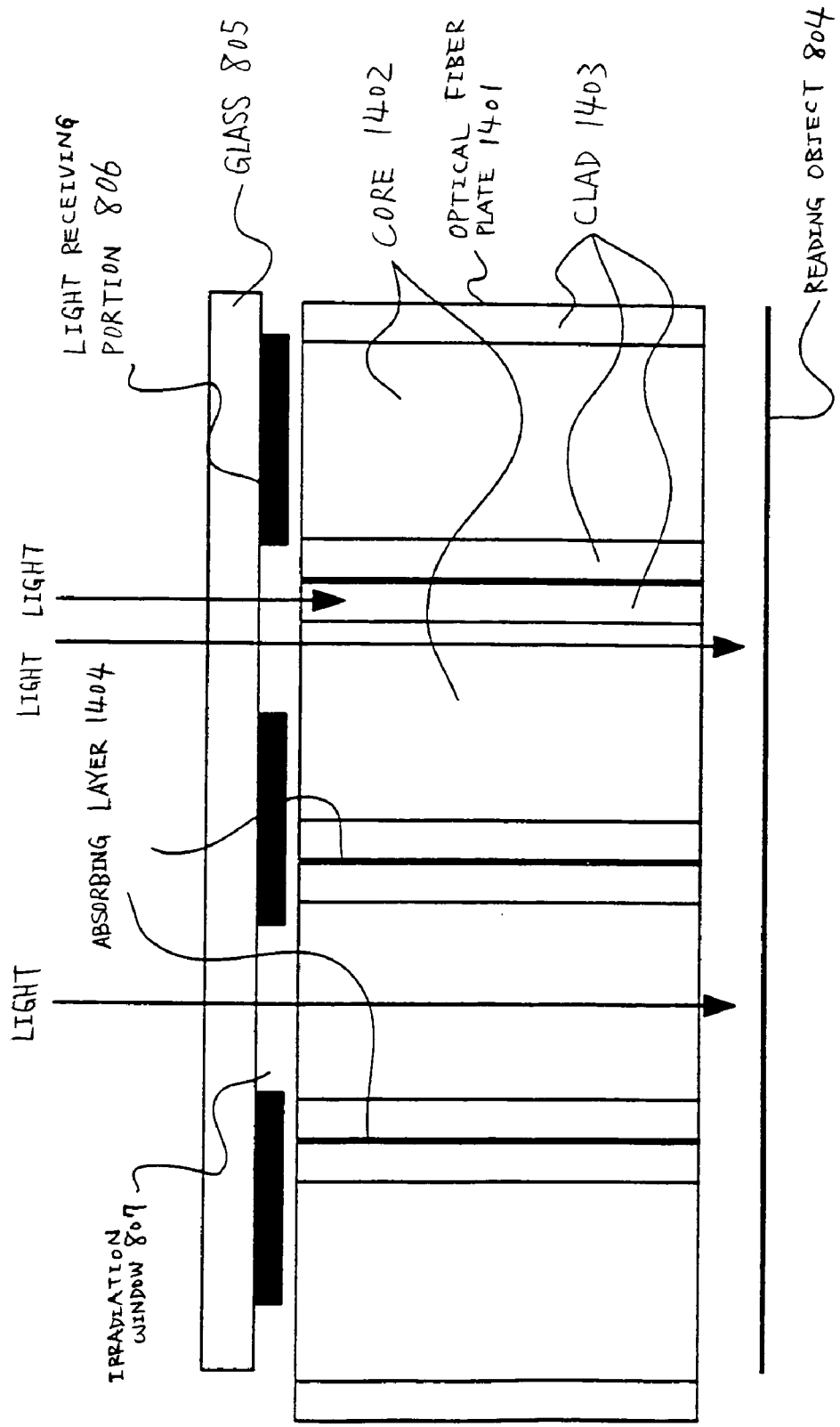
FIG. 15 is a sectional view of a completely close contact type sensor according to the invention.

FIG. 15 shows a sectional view when the optical fiber plate 1401 is arranged between the light receiving portion 806 and the reading object 804. The glass 805 is formed with the light receiving portion 806, the circuit portion and the irradiation window 807. The irradiation window 807 is transparent for transmitting light. The light receiving portion 806 is frequently formed with a light shielding film between the light receiving portion 806 and the glass 805 such that adverse influence is not effected even when light is incident on a side thereof opposed to the reading object 804. Further, the light receiving portion 806 and the circuit portion may be arranged to overlap.

Further, in FIG. 15, for simplicity, although there are illustrated only the light receiving portion 806 and the irradiation window 807 on the glass 805, actually, the circuit portion or the light shielding film may be formed thereon.

Further, in FIG. 15, for simplicity, although there is illustrated only the optical fiber plate between the light receiving portion 806 and the reading object 804, actually, there may be arranged other optical system, a protective system or glass.

Further, light is irradiated from a glass face which is not formed with the light receiving portion. However, there may be constituted an arrangement in which the light receiving portion 806, the glass 805 formed with the light receiving portion and the reading object 804 are arranged in this order by turning the glass 805 upside down.

The optical fiber can pertinently transmit light incident on the core 1402 by a small angle of incidence. However, it is difficult to propagate light other than thereof. In FIG. 15, a size (diameter) of the core 1402 is larger than a size of the irradiation window. In such a case although at a certain one of the irradiation window, light can be made to be incident on the core 1402, at other of the irradiation window, light capable of being made to be incident on the core 1402 is reduced. As a result, even with the irradiation window 807 having the same size, an intensity of light capable of being transmitted to the reading object 804 therefrom, differs. Then, by a positional relationship between the irradiation window 807 and the core 1402, the intensity of light irradiated to the reading object 804, differs. That is, the intensity of light irradiated to the reading object 804, differs depending on the pixel.

In consideration of the above-described, the size of the irradiation window 807 needs to be larger than the size (diameter) of the core 1402. In reality, in consideration also of sizes of the core 1402 and the clad 1403 and in consideration of the fact that there are a plurality of the irradiation windows 807 for one pixel, when an area of the irradiation window 807 is equal to or larger than a half of an area of a section of one piece of the optical fiber of the optical fiber plate 1401, no problem is posed actually. An upper limit of the area of the irradiation window 807 is automatically restricted since the upper limit cannot be made to be larger than the pixel size.

Further, Example 2 may freely be combined with Example 1.

Example 3

Next, a description will be given of a case of using a liquid crystal display (including backlight or a front light) as a light source for irradiation. When a light source is constituted by a liquid crystal display, as described in Example 2, it is preferable to align positions of an opening portion of the liquid crystal display and an irradiation window.

Figure 16:
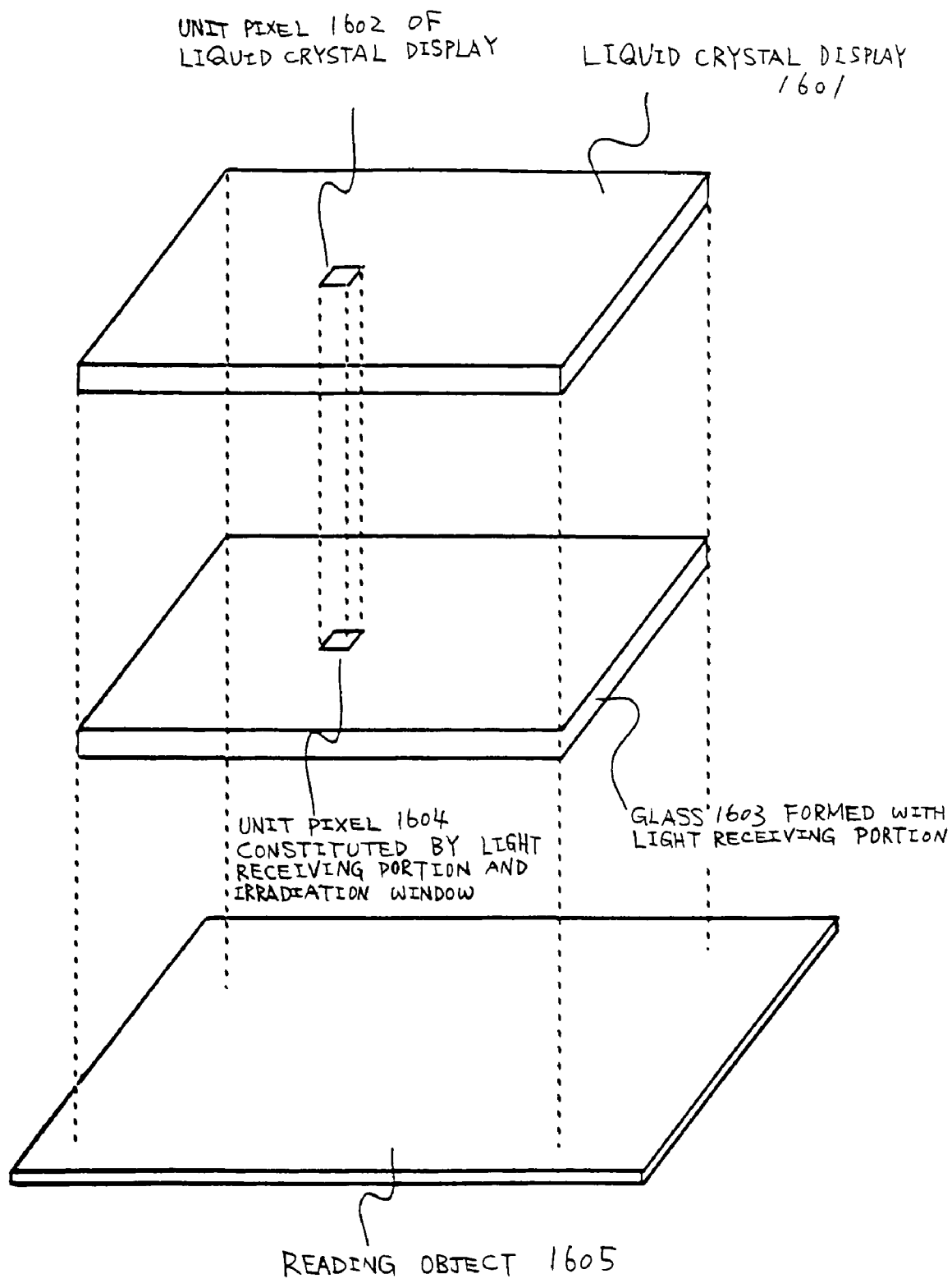
FIG. 16 is a perspective view of a completely close contact type sensor according to the invention and a liquid crystal display.

FIG. 16 shows a perspective view when a liquid crystal display is used as a light source for irradiation. First, a liquid crystal display 1601 is arranged at the topmost position as a light source (however, irradiation of a backlight or a front light is omitted). Glass 1603 formed with a light receiving portion is arranged therebelow. A reading object 1605 is arranged below the glass 1603 formed with the light receiving portion. Light emitted from the liquid crystal display 1601 is irradiated toward the glass 1603 formed with the light receiving portion. Further, light transmits through an irradiation window formed at the glass 1603 formed with the light receiving portion and is irradiated to the reading object 1605. Further, light reflected by the reading object 1605 is incident on the light receiving portion formed at the glass 1603 formed with the light receiving portion and is read as a signal.

Here, the liquid crystal display 1601 may be an STN type liquid crystal display or may be a TFT type liquid crystal display and is not particularly limited. Further, a material of liquid crystal may be TN liquid crystal, STN liquid crystal, liquid crystal for an IPS mode or ferroelectric liquid crystal and is not particularly limited. Further, the liquid crystal display 1601 may be of a transmission type or a reflection type and is not particularly limited so far as light is irradiated therefrom.

Further, the liquid crystal display 1601 may include a polarizer, a phase difference plate or a color filter as a constitution thereof other than a backlight or a front light.

Further, in FIG. 16, for simplicity, although nothing is illustrated between the glass 1603 formed with the light receiving portion and the reading object 1605, actually, there may be arranged an optical system, a protective film or glass. As an optical system, an optical fiber plate may be used or a rod lens array may be used.

Figure 17:
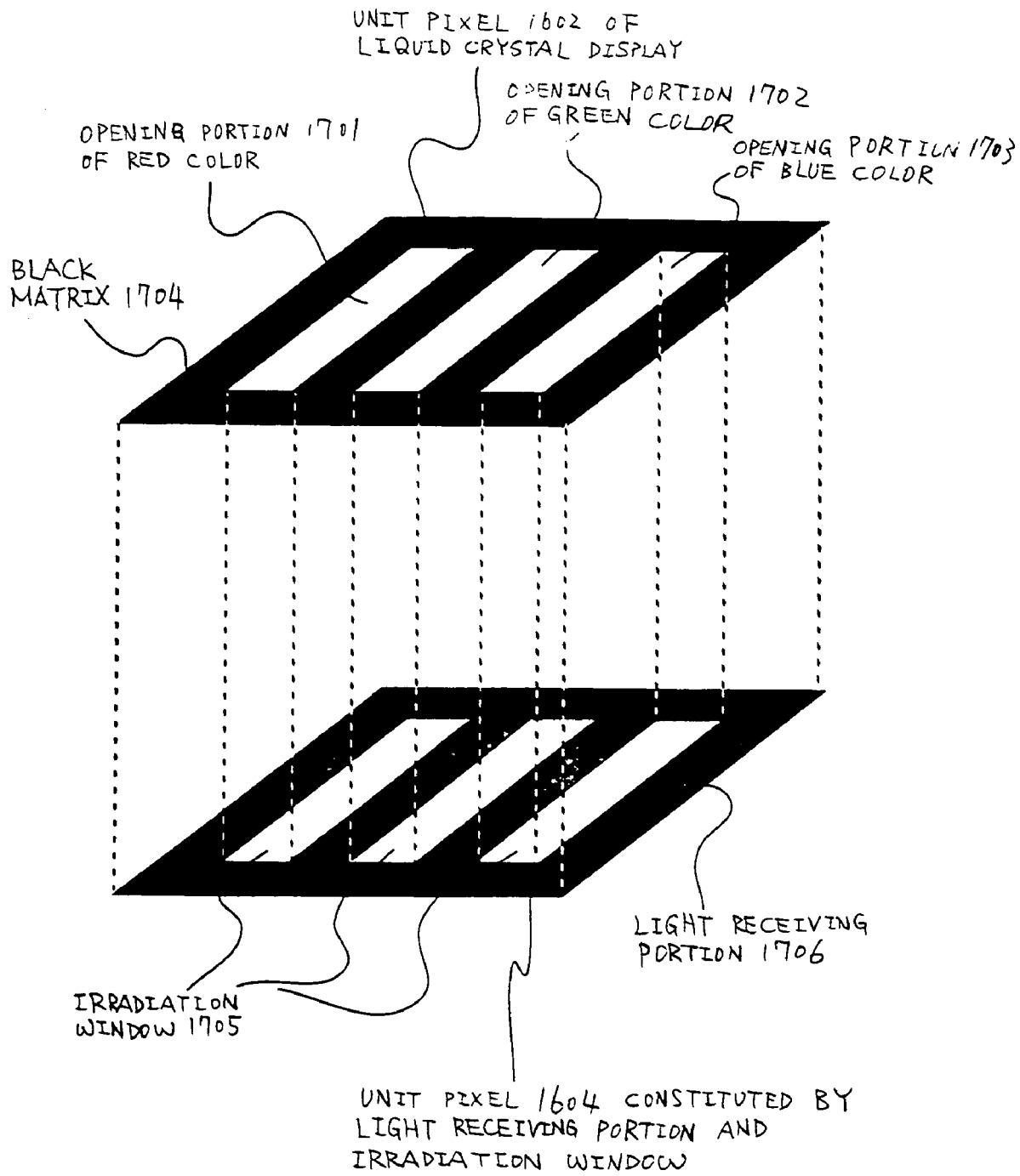
FIG. 17 is a perspective view of a completely close contact type sensor according to the invention and a pixel portion of a liquid crystal display.

Here, a description will be given of a positional relationship between a unit pixel 1602 of the liquid crystal display and a unit pixel 1604 constituted by the light receiving portion and irradiation windows. FIG. 17 shows an enlarged view thereof. In FIG. 17, in order to align positions of the opening portion of the liquid crystal display and the irradiation window of the sensor, a size of the unit pixel 1602 of the liquid crystal display and a size of the unit pixel 1604 constituted by the light receiving portion and irradiation windows are made the same. Further, positions of the opening portion of the liquid crystal display and the irradiation window are aligned. Thereby, light emitted from the liquid crystal display 1601 is hardly wasted and therefore, the light utilization efficiency is promoted.

FIG. 17 illustrates a color liquid crystal display as an object. That is, the unit pixel 1602 is arranged with an opening portion 1701 of red color, an opening portion 1702 of green color and an opening portion 1703 of blue color. At surroundings of the opening portions, there is arranged a black matrix 1704. Further, a single one of the unit pixel 1602 is constituted by the three colors.

Irradiation windows 1705 are formed to align with the opening portions of the liquid crystal display. By matching positions and sizes thereof, the light utilization efficiency can be promoted.

However, it is not necessarily needed that the irradiation windows 1705 are completely matched with the opening portions of the liquid crystal display in positions and sizes thereof but may be matched therewith as much as possible.

When the size of the unit pixel 1602 of the liquid crystal display and the size of the unit pixel 1604 constituted by the light receiving portion and the irradiation windows are made the same, the positions of the opening portion and irradiation window are easy to align. Further, when the positions are the same, numbers of the pixels are easy to be made the same and therefore, when an image read by the sensor is displayed on the liquid crystal display, processings of data are easy to execute. Therefore, it is preferable that the size of the unit pixel 1602 of the liquid crystal display and the size of the unit pixel 1604 constituted by the light receiving portion and the irradiation windows are made the same.

However, when the size of the unit pixel 1602 of the liquid crystal display is the size of the unit pixel 1604 constituted by the light receiving portion and the irradiation windows multiplied by an integer or a factor (fraction) of an integer thereof, the positions of the opening portion and their radiation window are easy to align, which is preferable.

Next, a description will be given of color formation of the sensor. When a color liquid crystal display is used as a light source, a color image can easily be read. Color liquid crystal display can emit three colors of light by switching respectives thereof and accordingly, a color image can be read by using monochromatic sensors.

Hence, a description will be given of a method of reading a color image. First, a color liquid crystal display irradiates light of only red color to the sensor. Further, in the meantime, an image of an entire screen is read by the sensor. Thereafter, the color liquid crystal display irradiates light of only green color to the sensor. Further, in the meantime, an image of the entire screen is read by the sensor. Finally, the color liquid crystal display irradiates light of only blue color to the sensor. Further, in the meantime, an image of the entire screen is read by the sensor. Thereafter, signals are synthesized.

That is, when a period of reading all of image information is defined as one frame period, the one frame period is divided into three subframe periods. Further, in the respective subframe period, the color liquid crystal display irradiates only a single color. Further, the color is successively switched. In the respective subframe period, the sensor reads the image of the entire screen. Further, after finishing the one frame period, images of the respective colors are synthesized to thereby form an image in color. By the above-described operation, the color image can be read.

Further, when the sensor in this case is an area sensor, in comparison with a case of using a conventional CCD type line sensor, various advantages are achieved. First, it is not necessary to move a line sensor and therefore, an image can be read at high speed. Further, in the case of the line sensor, it is necessary to repeat an operation of making light impinge, storing signals and reading an image for respective line. Therefore, it is necessary to switch a light source at high speed. Therefore, it is necessary to use LED as a light source. Further, since it is necessary to repeat the operation of making light impinge, storing signals and reading an image for respective line, a time period of reading is retarded. However, according to an area sensor, color of light is switched only at respective subframe and therefore, it is not necessary to switch the color of light at high speed.

Therefore, a normal fluorescent lamp can be used as a light source. Actually, only a pixel (color) for transmitting light by a liquid crystal display may be switched while a light source stays to be of white color light. Further, while storing signals at one line by making light impinge thereto, an image of other line can be read and accordingly, the image can be read at high speed.

Further, although in the example, a description has been given of the case in which the liquid crystal display is constituted by color, a monochromatic liquid crystal display may be used.

Further, Example 3 may freely be combined with Example 1 or Example 2.

Example 4

Figure 18:
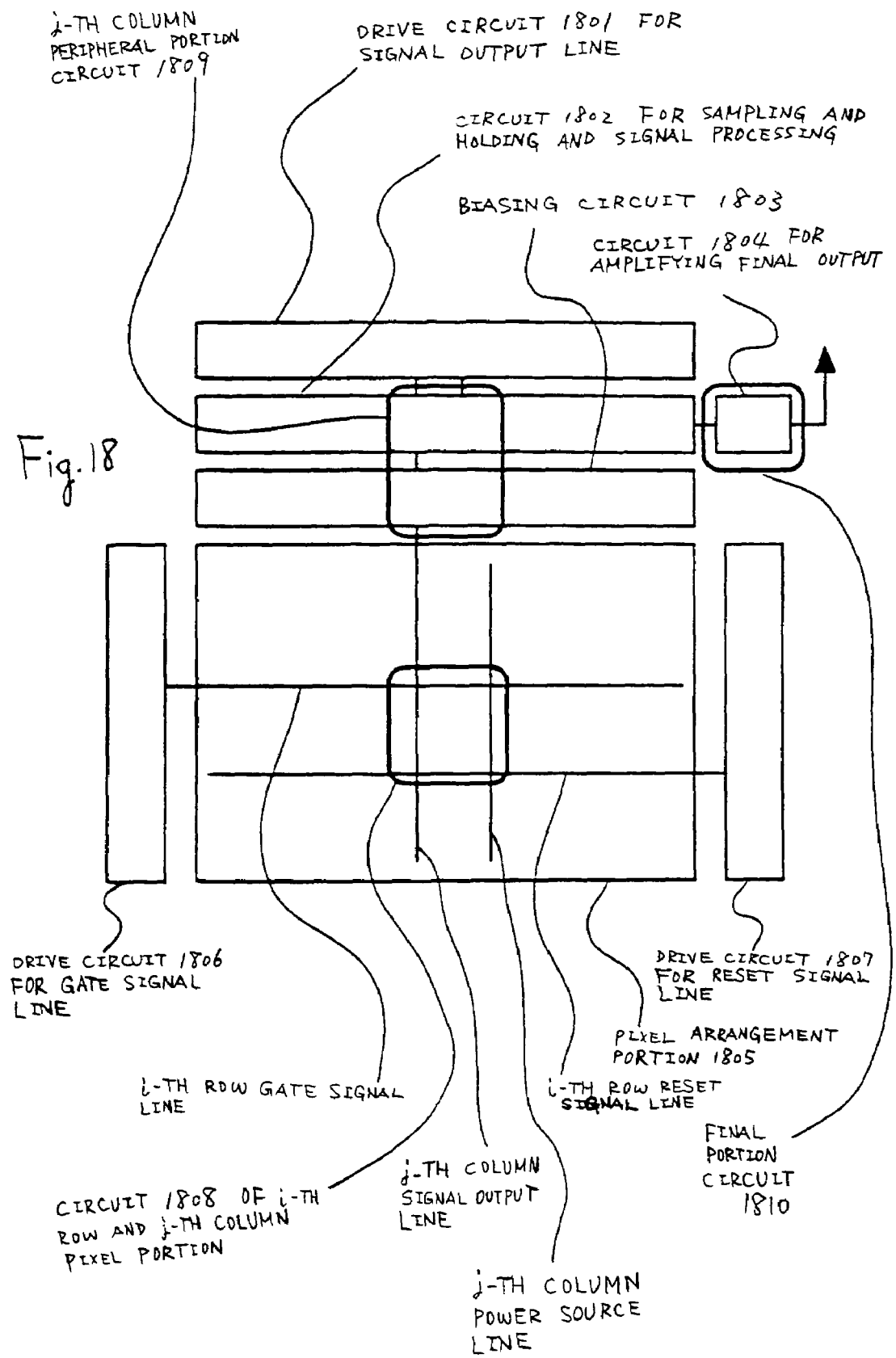
FIG. 18 is a block diagram of an area sensor according to the invention.

Next, a description will be given of an example of an area sensor mounted with a drive circuit at a periphery thereof and arranged with pixels two-dimensionally. FIG. 18 shows a circuit diagram of a total thereof. First, there is provided a pixel arrangement portion 1805 arranged with pixels two-dimensionally. Further, there are arranged drive circuits for driving a gate signal line and a reset signal line of respective pixel on the left and on the right of the pixel arrangement portion 1805. In FIG. 18, a drive circuit 1806 for a gate signal line is arranged on the left side and a drive circuit 1807 for a reset signal line is arranged on the right side.

Further, on an upper side of the pixel arrangement portion 1805, there are arranged circuits for signal processing. In FIG. 18, a biasing circuit 1803 is arranged on the upper side of the pixel arrangement portion 1805. The biasing circuit 1803 constitutes a source follower circuit by being paired with an amplifying transistor of respective pixel. On the upper side of the biasing circuit 1803, there is arranged a circuit 1802 for sampling and holding and signal processing. In the circuit, there are arranged circuits for temporarily holding a signal, executing analog to digital conversion and reducing noise. On the upper side of the sampling and holding and signal processing circuit 1802, there is arranged a drive circuit 1801 for a signal output line. The drive circuit 1801 for a signal output line outputs a signal for successively outputting the temporarily held signal. Further, there is arranged a circuit 1804 for amplifying a final output before outputting a signal to outside. In the circuit, a signal which is successively outputted by the sampling and holding and signal processing circuit 1802 and the drive circuit 1801 for a signal output line, is amplified before being outputted to outside. Therefore, the circuit is not needed when the signal is not amplified, however, the circuit is frequently arranged in reality.

Figure 19:
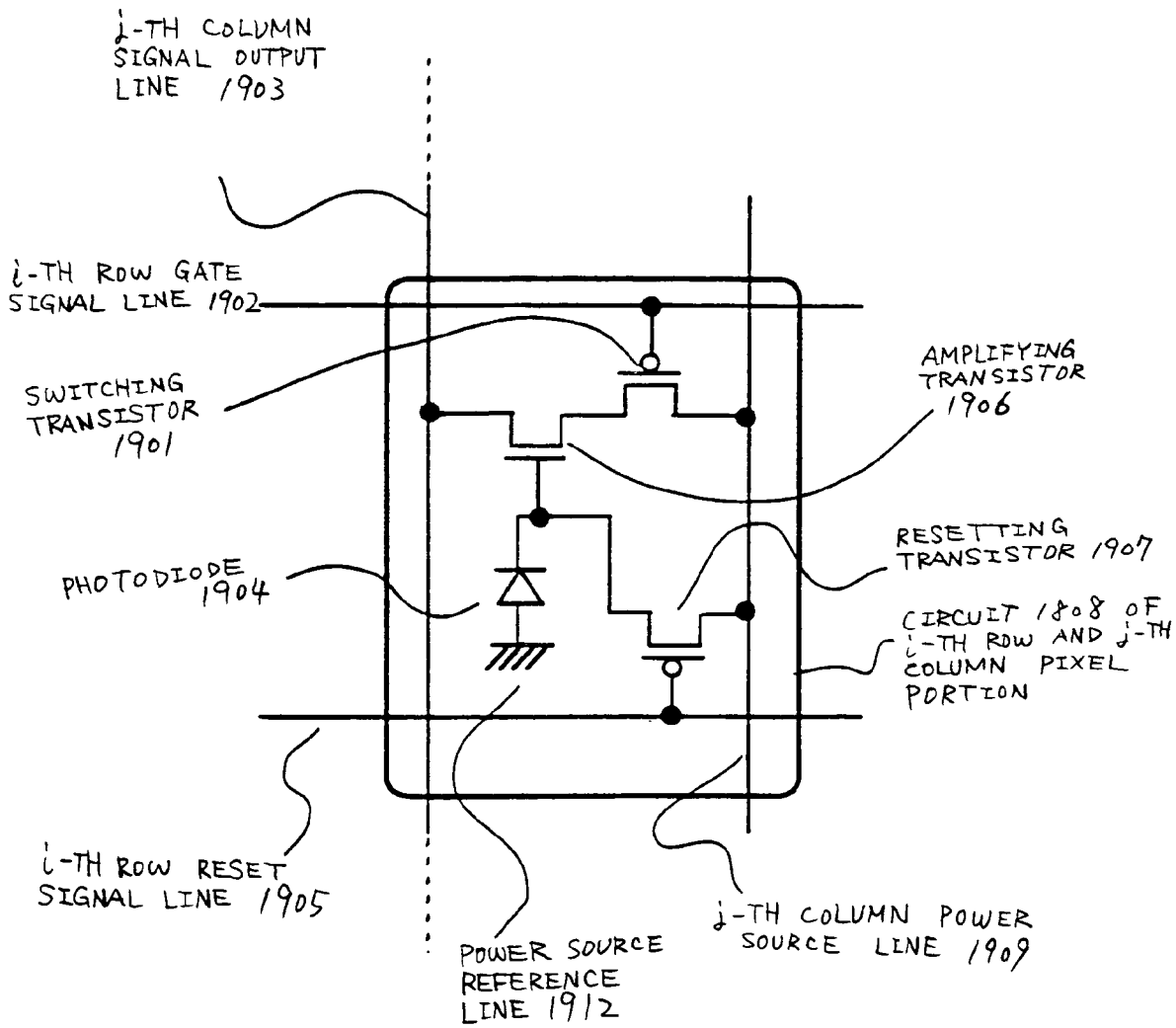
FIG. 19 is a circuit diagram of a pixel of an active sensor according to the invention.

Next, circuit diagrams of respective portions will be shown. First, FIG. 19 shows a circuit diagram of a circuit 1808 of an i-th row and j-th column pixel portion as an example in the pixel arrangement portion 1805 which is arranged with pixels two-dimensionally. In FIG. 19, the circuit 1808 is constituted by a P-channel type resetting transistor 1907, a P-channel type switching transistor 1901, an N-channel type amplifying transistor 1906 and a photo-electric conversion element (here, a photodiode 1904 which is most representative). In the photodiode 1904, a P-channel side terminal thereof is connected to a power source reference line 1912 and an N-channel side terminal thereof is connected to a gate terminal of the amplifying transistor 1906. A gate terminal of the resetting transistor 1907 is connected with an i-th row reset signal line 1905 and a source terminal and a drain terminal thereof are connected to a j-th column power source line 1909 and the gate terminal of the amplifying transistor 1906. A gate terminal of the switching transistor 1901 is connected to an i-th row gate signal line 1902 and a source terminal and a drain terminal thereof are connected to the j-th column power source line 1909 and the amplifying transistor 1906. A source terminal and a drain terminal of the amplifying transistor 1906 are connected to a j-th column signal output line 1903 and the switching transistor 1901.

In FIG. 19, p-channel type is used in the resetting transistor 1907. However, the resetting transistor may be of an N-channel type. However, in the case of the N-channel type, in resetting operation, voltage between the gate and the source cannot be made large. Therefore, the resetting transistor is operated in a saturated region and the photodiode 1904 cannot be charged sufficiently. Therefore, although the resetting transistor can be operated with the N-channel type, the p-channel type is more preferable.

It is preferable that the switching transistor 1901 is arranged between the i-th column power source line 1909 and the amplifying transistor 1906 and the P-channel type is used therefor. However, an N-channel type may be used therefor since the switching transistor 1901 is operated even with the N-channel type similar to the conventional case and may be arranged between the j-th column signal output line 1903 and the amplifying transistor 1906. However, the N-channel type one is difficult to correctly output a signal and accordingly, it is preferable that the switching transistor 1901 is arranged between the j-th column power source line 1909 and the amplifying transistor 1906 and the P-channel type is used therefor.

In FIG. 19, the N-channel type is used for the amplifying transistor 1906. However, a P-channel type can be used therefor. However, in that case, when the amplifying transistor 1906 is operated as a source follower circuit by being combined with a biasing transistor, it is necessary to change a method of connecting the circuit. That is, the amplifying transistor 1906 is not operated by simply changing the polarity of the amplifying transistor 1906 in the circuit diagram of FIG. 19.

Figure 20:
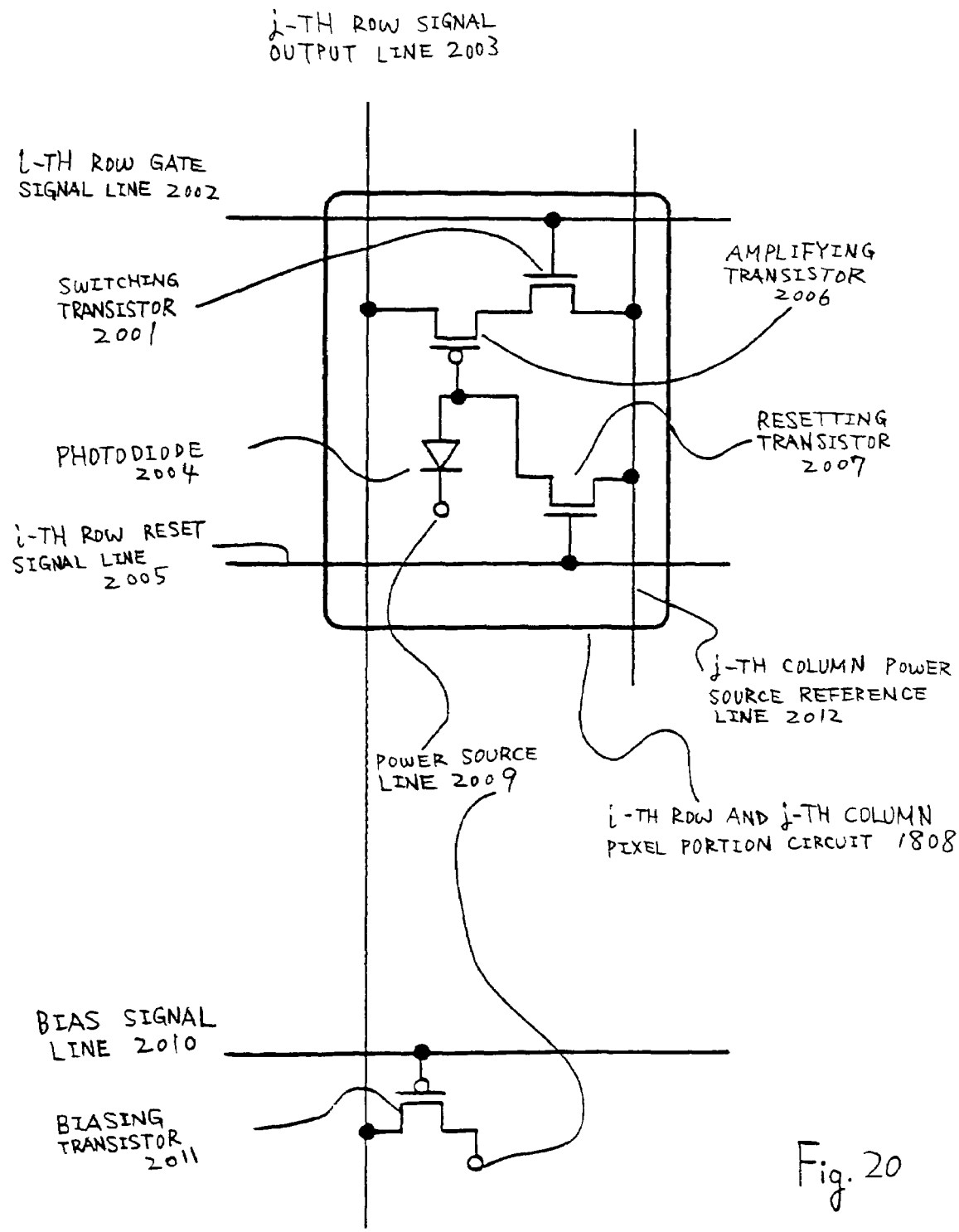
FIG. 20 is a circuit diagram of a pixel of an active sensor according to the invention.

Hence, FIG. 20 shows an example of a circuit constitution when the amplifying transistor of the P-channel type is used. A difference of constitution from that of FIG. 19 resides in that the polarity of an amplifying transistor 2006 is of the P-channel type, a direction of a photodiode is reversed and a power source line and a power source reference line are switched. When the P-channel type is used for the amplifying transistor, it is necessary to use the P-channel type in a biasing transistor. Because the biasing transistor needs to operate as a constant current source. Therefore, in FIG. 20, for reference, a biasing transistor 2011 is also illustrated. The i-th row and j-th column pixel portion circuit 1808 shown in FIG. 20 is constituted by an N-channel type resetting transistor 2007, an N-channel type switching transistor 2001, a P-channel type amplifying transistor 2006 and a photoelectric conversion element (here, a photodiode 2004 which is most representative). An N-channel side terminal of the photodiode 2004 is connected to a power source line 2009 and a P-channel side terminal thereof is connected to a gate terminal of the amplifying transistor 2006. A gate terminal of the resetting transistor 2007 is connected with an i-th row reset signal line 2005 and a source terminal and a drain terminal thereof are connected to a j-th column power source reference line 2012 and the gate terminal of the amplifying transistor 2006. A gate terminal of the switching transistor 2001 is connected to an i-th row gate signal line 2002 and a source terminal and a drain terminal thereof are connected to the j-th column power source reference line 2012 and the amplifying transistor 2006. A source terminal and a drain terminal of the amplifying transistor 2006 are connected to a j-th row signal output line 2003 and the switching transistor 2001. A gate terminal of the biasing transistor 2001 is connected with a bias signal line 2010 and a source terminal and a drain terminal thereof are connected to the j-th column signal output line 2003 and the power source line 2009.

In FIG. 20, the N-channel type is used for the resetting transistor 2007. However, the resetting transistor may be of a P-channel type. However, in the case of the P-channel type, in resetting operation, voltage between the gate and the source cannot be made large. Therefore, the resetting transistor is operated in a saturated region and the photodiode 2004 cannot be charged sufficiently. Therefore, although the resetting transistor is operated by the P-channel type, the N-channel type is preferable.

In FIG. 20, it is preferable that the switching transistor 2001 is arranged between the j-th column power source reference line 2012 and the amplifying transistor 2006 and the N-channel type is used therefor. However, the switching transistor 2001 is operated also by a P-channel type and accordingly, the P-channel type may be used therefor and may be arranged between the j-th column signal output line 2003 and the amplifying transistor 2006. However, it is difficult to correctly output a signal and therefore, it is preferable that switching transistor 2001 is arranged between the j-th column power source reference line 2009 and the amplifying transistor 2006 and the N-channel type is used therefor.

In this way, as is apparent by comparing FIG. 19 and FIG. 20, when the polarity of the amplifying transistor is changed, an optimum constitution of the transistor and the direction of the photodiode are also changed.

In FIG. 19, current is supplied from a single piece of the power source line to both of the switching transistor 1901 and the resetting transistor 1907. In FIG. 20, current is supplied from a single piece of the power source reference line to both of the switching transistor 2001 and the resetting transistor 2007. In this way, by matching the direction of the photodiode and the polarity of the amplifying transistor, wirings can be shared.

Figure 21:
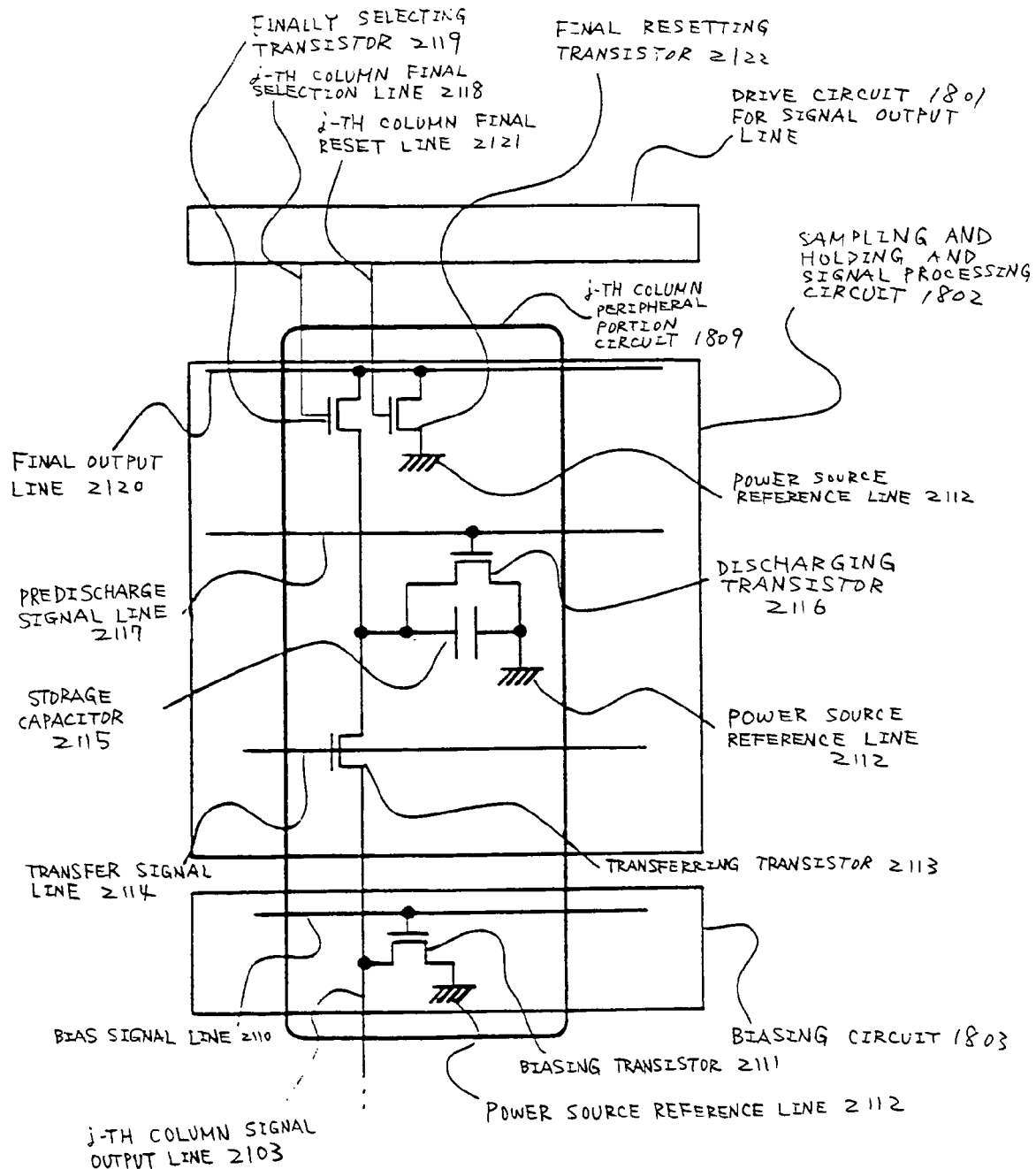
FIG. 21 is a circuit diagram of a signal processing circuit according to the invention.

Next, FIG. 21 shows a circuit diagram of a j-th column peripheral portion circuit 1809 as a circuit for one column from the biasing circuit 1803 and the sampling and holding signal processing circuit 1802. The biasing circuit 1803 is arranged with a biasing transistor 2111. The polarity is the same as the polarity of the amplifying transistor of respective pixel. Therefore, when the amplifying transistor of pixel is of an N-channel type, the biasing transistor is also of the N-channel type. In FIG. 21, the biasing transistor 2111 is of the N-channel type. A gate terminal of the biasing transistor 2111 is connected with a bias signal line 2110 and a source terminal and a drain terminal thereof are connected to a j-th column signal output line 2103 and a power source reference line 2112 (when the biasing transistor is of a P-channel type, a power source line is used in place of the power source reference line). The biasing transistor 2111 is operated as a source follower circuit by being paired with the amplifying transistor of respective pixel. A gate terminal of a transferring transistor 2113 is connected with a transfer signal line 2114 and a source terminal and a drain terminal thereof are connected to a j-th column signal output line 2103 and a storage capacitor 2115. The transferring transistor is operated when potential of the signal output line 2103 is transferred to the storage capacitor 2115. Therefore, a transferring transistor of a P-channel type may be added and connected in parallel with the N-channel type transferring transistor 2113. The storage capacitor 2115 is connected to the transferring transistor 2113 and a power source reference line 2112. The role of the storage capacitor 2115 resides in temporarily storing a signal outputted from the signal output line 2103. A gate terminal of a discharging transistor 2116 is connected to a predischarge signal line 2117 and a source terminal and a drain terminal thereof are connected to the storage capacitor 2115 and the power source reference line 2112. The discharging transistor 2116 is operating to temporarily discharge electric charge stored in the storage capacitor 2115 before inputting the potential of the signal output line 2103 to the storage capacitor 2115.

Further, an analog to digital signal conversion circuit or a noise reducing circuit can also be arranged.

Further, a finally selecting transistor 2119 is connected between the storage capacitor 2115 and a final output line 2120. A source terminal and a drain terminal of the finally selecting transistor 2119 are connected to the storage capacitor 2115 and the final output line 2120. and a gate terminal thereof is connected to a j-th column final selection line 2118. The final selection line is scanned successively from a first column. Further, when the j-th column final selection line 2118 is selected and the finally selecting transistor 2119 is brought into a conductive state, potential of the storage capacitor 2115 and potential of the final output line 2120 become equal to each other. As a result, a signal stored in the storage capacitor 2115 can be outputted to the final output line 2120. However, when electric charge is stored in the final output line 2120 before outputting the signal to the final output line 2120, the potential in outputting the signal to the final output line 2120 is influenced by the electric charge. Therefore, before outputting the signal to the final output line 2120, the potential of the final output line 2120 must be initialized to a certain potential value. In FIG. 21, a final resetting transistor 2122 is arranged between the final output line 2120 and a power source reference line 2112. Further, a gate terminal of the finally resetting transistor 2122 is connected with a j-th column final reset line 2121. Further, before selecting the j-th final selecting line 2118, the j-th column final reset line 2121 is selected and the potential of the final output line 2120 is initialized to potential of the power source reference line 2112. Thereafter, the j-th column final selection line 2118 is selected and the signal stored to the storage capacitor 2115 is outputted to the final output line 2120.

Figure 22:
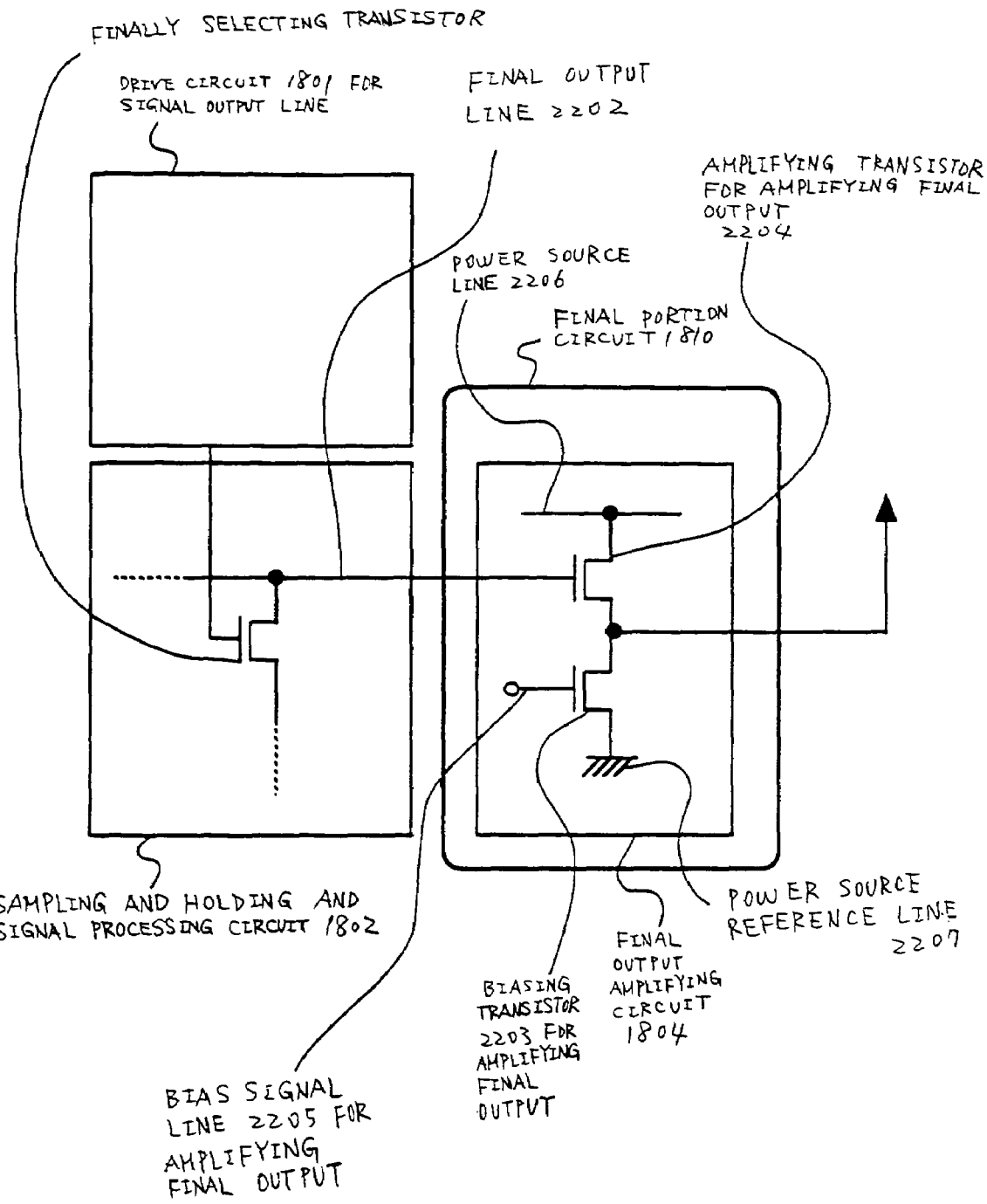
FIG. 22 is a circuit diagram of a final output amplifying circuit according to the invention.

The signal outputted to the final output line 2120 may be outputted to outside as it is. However, the signal is frequently amplified before being outputted to outside since the signal is very weak. FIG. 22 shows a circuit of a final portion circuit 1810 as a circuit therefor. There are various circuits for amplifying a signal such as an operational amplifier. Although any circuit may be used so far as the circuit is a circuit for amplifying a signal, in this case, as the simplest circuit constitution, a source follower circuit is shown. FIG. 22 shows a case of an N-channel type. A final output line 2202 is constituted in inputting a signal to the final output amplifying circuit 1804. The final output line 2202 is outputted with a signal successively from a first column. The signal is amplified by the final output amplifying circuit 1804 and is outputted to outside. The final output line 2202 is connected to a gate terminal of an amplifying transistor 2204 for amplifying final output. A drain terminal of the amplifying transistor 2204 for amplifying final output is connected to a power source line 2206 and a source terminal thereof constitutes an output terminal. A gate terminal of a biasing transistor 2203 for amplifying final output is connected to a bias signal line 2205 for amplifying final output. A source terminal and a drain terminal thereof are connected to a power source reference line 2207 and a source terminal of the amplifying transistor 2204 for amplifying final output.

Figure 23:
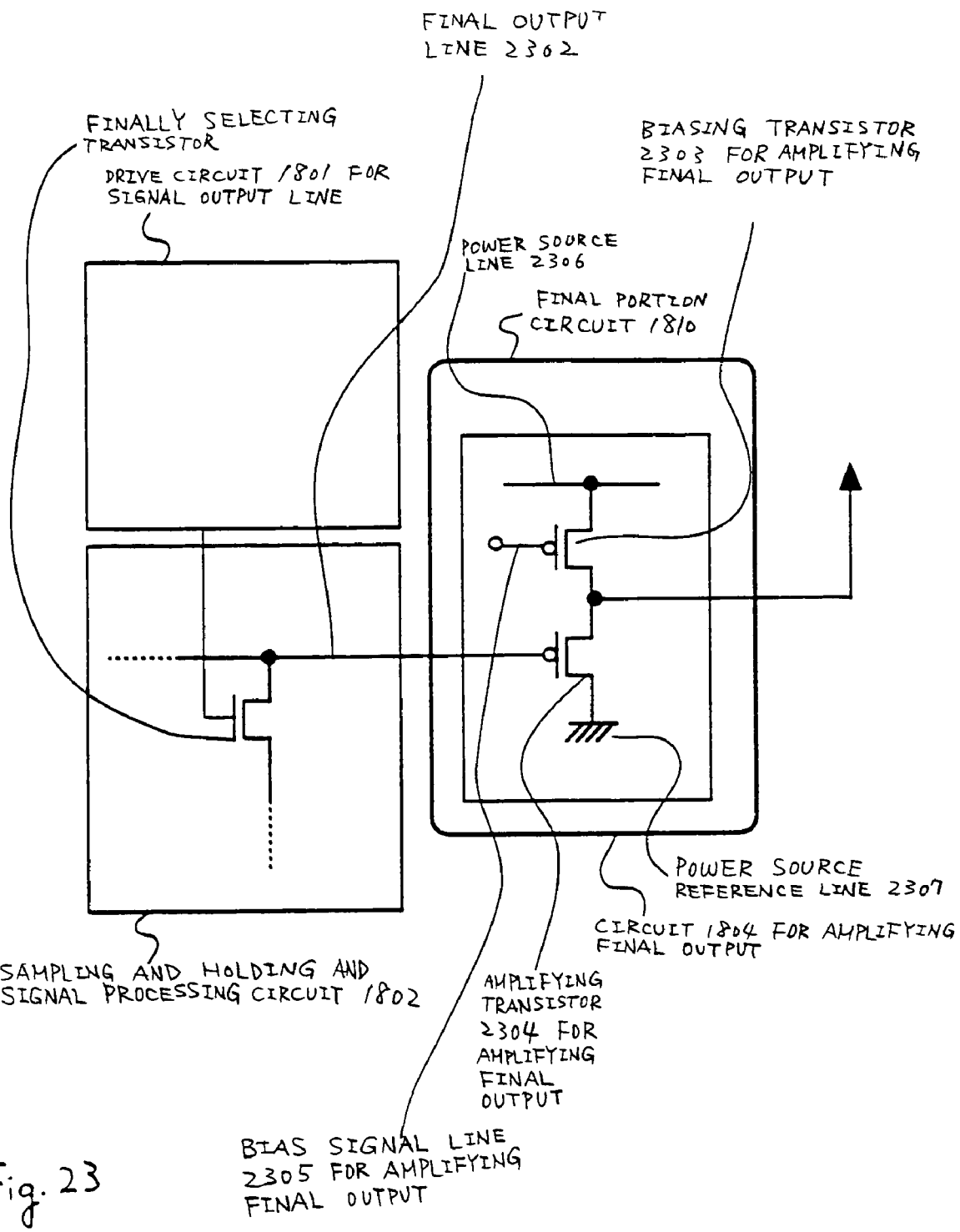
FIG. 23 is a circuit diagram of a final output amplifying circuit according to the invention.

FIG. 23 shows a circuit diagram when a source follower circuit in the case of a P-channel type is used. A difference between FIG. 22 and FIG. 23 resides in that the power source line and the power source reference line are reversed. A final output line 2302 is connected to a gate terminal of an amplifying transistor 2304 for amplifying final output. A drain terminal of the amplifying transistor 2304 for amplifying final output is connected to a power source reference line 2307 and a source terminal thereof constitutes an output terminal. A gate terminal of a biasing transistor 2303 for amplifying final output is connected to a bias signal line 2305 for amplifying final output. A source terminal and a drain terminal thereof are connected to a power source line 2306 and the source terminal of the amplifying transistor 2304 for amplifying final output. Values of potential of the bias signal line 2305 for amplifying final output and potential of the biasing signal 2205 for amplifying final output in the case of using the N-channel type, differ from each other.

In FIG. 22 and FIG. 23, the source follower circuit of only one stage is constituted. However, source follower circuits of a plurality of stages may be constituted. For example, when source follower circuits of two stage are constituted, an output terminal of a first stage may be connected to an input terminal of a second stage thereof. Further, in the respective stage, either of the N-channel type and the P-channel type may be used.

The drive circuit 1806 for a gate signal line, the drive circuit 1807 for a reset signal line and the drive circuit 1801 for a signal output line are circuits simply outputting pulse signals. Therefore, the circuits can be implemented by using a publicly-known technology.

Next, a description will be given of timing charts of signals. First, FIG. 24 shows timing charts of the circuits of FIG. 18 and FIG. 19. The reset signal lines are successively scanned from the first row. For example, an (i−1)-th row is selected, successively, an i-th row is selected and successively, an (i+1)-th row is selected. A period until selecting the same row again corresponds to the frame period. The gate signal lines are similarly scanned successively from the first row. However, a timing of starting to scan the gate signal line is later than a timing of starting to scan the reset signal line. For example, when attention is paid to a pixel of the i-th row, the reset signal line of the i-throw is selected and thereafter, the gate signal line of the i-th row is selected. When the gate signal line of the i-th row is selected, a signal is outputted from the pixel of the i-th row. A time period from when the pixel is reset until the signal is outputted constitutes a storage time period. During the storage time period, the photodiode stores electric charge generated by light. In the respective row, a timing of resetting and a timing of outputting the signal, differ from each other. Therefore, although the storage time period is equal in the pixels of all the rows, storage time differs.

Next, FIG. 25 shows timing charts of signals in FIG. 21. Since the operation is repeated, as an example, a consideration will be given of the case of selecting the gate signal line of the i-th row. First, after selecting the gate signal line 1902 of the i-th row, the predischarge signal line 2117 is selected and the discharging transistor 2116 is brought into a conductive state. Thereafter, the transfer signal line 2114 is selected. Then, a signal of respective row is outputted from the pixel of the i-th row to the storage capacitor 2115 of the respective row.

After storing signals of all of the pixels at the i-th row in the storage capacitors 2115 of the respective columns, signals of the respective columns are successively outputted to the final output line 2120. During a time period after the transfer signal line 2114 is not selected until the gate signal line is selected, all the columns are scanned by the drive circuit 1801 for a signal output line. First, the final reset line of the first column is selected, the finally resetting transistor 2122 is brought into a conductive state and the final output line 2120 is initialized to the potential of the power source reference line 2112. Thereafter, the final selection line 2118 of the first column is selected, the finally selecting transistor 2119 is brought into a conductive state and a signal of the storage charge 2115 of the first column is outputted to the final output line 2120. Next, the final reset line of a second column is selected, the final resetting transistor 2122 is brought into a conductive state and the final output line 2120 is initialized to potential of the power source reference line 2112. Thereafter, the final selection line 2118 of the second column is selected, the finally selecting transistor 2119 is brought into a conductive state and a signal of the storage capacitor 2115 at the second column is outputted to the final output line 2120. Thereafter, similar operation is repeated. In the case of a j-th column, the final reset line of the j-th column is selected, the finally resetting transistor 2122 is brought into a conductive state and the final output line 2120 is initialized to the potential of the power source reference line 2112. Thereafter, the final selection line 2118 of the j-th column is selected, the finally selecting transistor 2119 is brought into a conductive state and a signal of the storage capacitor 2115 of the j-th column is outputted to the final output line 2120. Successively, the final reset line of a (j+1)-th column is selected, the finally resetting transistor 2122 is brought into a conductive state and the final output line 2120 is initialized to potential of the power source reference line 2112. Thereafter, the final selection line 2118 of the (j+1)-th column is selected, the final selecting transistor 2119 is brought into a conductive state and a signal of the storage capacitor 2115 of the (j+1)-th column is outputted to the final output line 2120. Thereafter, similar operation is repeated and signals of all the columns are successively outputted to the final output line. During the time period, the potential of the bias signal line 2110 stays to be constant. The signal outputted to the final output line 2120 is amplified by the circuit 1804 for amplifying final output and is outputted to outside.

Next, the gate signal line of a (i+1)-th row is selected. Then, the operation is carried out similar to that in selecting the gate signal line of the i-th row. Further, the gate signal line of a successive row is selected and similar operation is repeated.

Further, the sensor portion for executing photoelectric conversion may be a diode of a PIN type, an avalanche type diode, an npn embedded type diode, a Schottky type diode, a photoconductor for X-ray or a sensor for infrared ray other than the normal photo diode of a PN type. Further, after converting X-ray into light by a fluorescent member or a sintilator, the light may be read.

As has been described above, the photoelectric conversion element is frequently connected to an input terminal of a source follower circuit. However, a switch may be interposed therebetween as in a photo gate type. Or, as in a logarithmic conversion type, a signal after having been processed to constitute a logarithmic value of optical intensity may be inputted to the input terminal.

Although according to the example, a description has been given of an area sensor arranged with pixels two-dimensionally, a line sensor arranged with pixels one-dimensionally can also be realized.

Further, Example 4 can be freely combined with Example 1 through Example 3.

Example 5

A method of manufacturing a sensor of this invention on a glass using a TFT is explained with reference to FIGS. 26 to 29.

First, as shown in FIG. 26A, a base film 201 is formed to a thickness of 300 nm on a glass substrate 200. A silicon oxinitride film is laminated as the base film 201 in Example 5. At this point, it is appropriate to set the nitrogen concentration to between 10 and 25 wt % in the film contacting the glass substrate 200. In addition, it is effective that the base film 201 has a thermal radiation effect, and a DLC (diamond-like carbon) film may also be provided.

Next, an amorphous silicon film (not shown in the figure) is formed with a thickness of 50 nm on the base film 201 by a known deposition method. Note that it is not necessary to limit to the amorphous silicon film, and a semiconductor film containing an amorphous structure (including a microcrystalline semiconductor film) may be used. In addition, a compound semiconductor film containing an amorphous structure, such as an amorphous silicon germanium film, may also be used. Further, the film thickness may be made from 25 to 100 nm.

The amorphous silicon film is then crystallized by a known technique, forming a crystalline silicon film (also referred to as a polycrystalline silicon film or a polysilicon film) 202. Thermal crystallization using an electric furnace, laser annealing crystallization using a laser light, and lamp annealing crystallization using an infrared light as known crystallization methods. Crystallization is performed in Example 5 using an excimer laser light, which uses XeCl gas.

Note that pulse emission excimer laser light formed into a linear shape is used in Example 5, but a rectangular shape may also be used. Continuous emission type argon laser light and continuous emission type excimer laser light can also be used.

In this Example, although the crystalline silicon film is used as the active layer of the TFT, it is also possible to use an amorphous silicon film as the active layer.

Note that it is effective to form the active layer of a resetting transistor, in which there is a necessity to reduce the off current, by the amorphous silicon film, and to form the active layer of an amplifying transistor by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 26B, a protective film 203 is formed on the crystalline silicon film 202 with a silicon oxide film having a thickness of 130 nm. This thickness may be chosen within the range of 100 to 200 nm (preferably between 130 and 170 nm). Furthermore, another films such as insulating films containing silicon may also be used. The protective film 203 is formed so that the crystalline silicon film is not directly exposed to plasma during addition of an impurity, and so that it is possible to have delicate concentration control of the impurity.

Resist masks 204a, 204b, and 204c are then formed on the protective film 203, and an impurity element, which imparts n-type conductivity (hereafter referred to as an n-type impurity element), is added through the protective film 203. Note that elements residing in periodic table group 15 are generally used as the n-type impurity element, and typically phosphorous or arsenic can be used. Note that a plasma doping method is used, in which phosphine ($PH_3$) is plasma-excited without separation of mass, and phosphorous is added at a concentration of $1 \times 10^{18}$ atoms/cm$^3$ in Example 5. An ion implantation method, in which separation of mass is performed, may also be used, of course.

The dose amount is regulated such that the n-type impurity element is contained in n-type impurity regions (b) 205a, 205b thus formed by this process, at a concentration of $2 \times 10^{16}$ to $5 \times 10^{19}$ atoms/cm$^3$ (typically between $5 \times 10^{17}$ and $5 \times 10^{18}$ atoms/cm$^3$).

Next, as shown in FIG. 26C, the protective film 203 and the resist masks 204a, 204b, and 204c are removed, and an activation of the added n-type impurity elements is performed. A known technique of activation may be used as the means of activation, but activation is done in Example 5 by irradiation of excimer laser light (laser annealing). Of course, a pulse emission excimer laser and a continuous emission excimer laser may be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 203 in place.

The activation of impurity elements by heat treatment (furnace annealing) may also be performed along with activation of the impurity element by laser light. When activation is performed by heat treatment, considering the heat resistance of the substrate, it is good to perform heat treatment at about 450 to 550° C.

A boundary portion (connecting portion) with end portions of the n-type impurity regions (b) 205a, 205b, namely regions, in which the n-type impurity element is not added, on the periphery of the n-type impurity regions (b) 205a, 205b, is delineated by this process. This means that, at the point when the TFTs are later completed, extremely good connecting portion can be formed between LDD regions and channel forming regions.

Unnecessary portions of the crystalline silicon film are removed next, as shown in FIG. 26D, and island-shape semiconductor films (hereinafter referred to as active layers) 206 to 210 are formed.

Figure 27A:
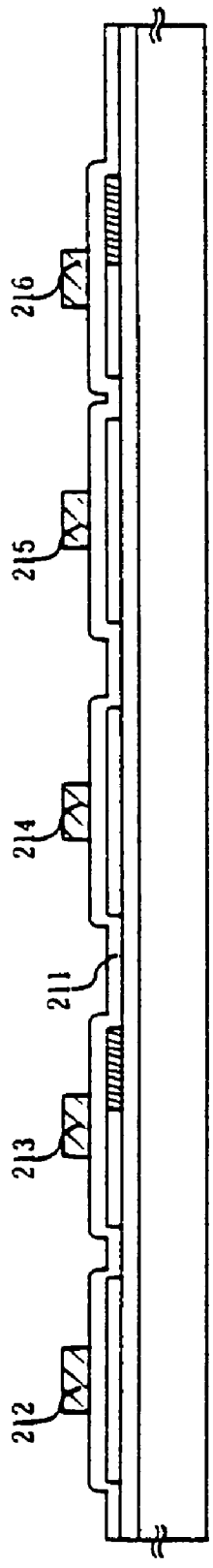
FIGS. 27A, 27B, 27C and 27D are views showing steps of fabricating an image sensor according to the invention.

Then, as shown in FIG. 27A, a gate insulating film 211 is formed, covering the active layers 206 to 210. An insulating film containing silicon and with a thickness of 10 to 200 nm, preferably between 50 and 150 nm, may be used as the gate insulating film 211. A single layer structure or a lamination structure may be used. A 110 nm thick silicon oxinitride film is used in Example 5.

Thereafter, a conductive film having a thickness of 200 to 400 nm is formed and patterned to form gate electrodes 212 to 216. In Example 5, the gate electrodes and wirings (hereinafter referred to as gate wirings) electrically connected to the gate electrodes for providing conductive paths are formed of the same materials. Of course, the gate electrode and the gate wiring may be formed of different materials from each other. More specifically, the gate wirings are made of a material having a lower resistivity than the gate electrodes. This is because a material enabling fine processing is used for the gate electrodes, while the gate wirings are formed of a material that can provide a smaller wiring resistance but is not suitable for fine processing. The wiring resistance of the gate wiring can be made extremely small by using this type of structure, and therefore a sensor portion having a large surface area can be formed. Namely, the above described pixel structure is extremely effective when an area sensor with a sensor portion having a screen size of a 10 inch diagonal or larger (in addition, a 30 inch or larger diagonal) is realized.

Although the gate electrode can be made of a single-layered conductive film, it is preferable to form a lamination film with two layers or three layers, if necessary. Any known conductive films can be used for the gate electrodes 212 to 216.

Typically, it is possible to use a film made of an element selected from the group consisting of aluminum (Al), tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or a titanium silicide film). Of course, the films may be used as a single layer or a laminate layer.

In Example 5, a laminate film of a tungsten nitride (WN) film having a thickness of 30 nm and a tungsten (W) film having a thickness of 370 nm is used. This may be formed by sputtering. When an inert gas such as Xe or Ne is added as a sputtering gas, film peeling due to stress can be prevented.

The gate electrodes 213 and 216 are respectively formed at this time so as to overlap a portion of the n-type impurity regions (b) 205a and 205b through the gate insulating film 211. This overlapping portion later becomes an LDD region overlapping the gate electrode.

Figure 27B:
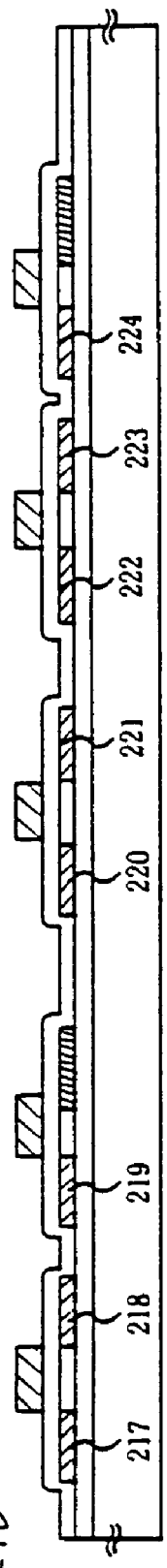

Next, an n-type impurity element (phosphorous is used in Example 5) is added in a self-aligning manner with the gate electrodes 212 to 216 as masks, as shown in FIG. 27B. The addition is regulated such that phosphorous is added to n-type impurity regions (c) 217 to 224 thus formed at a concentration of $\frac{1}{10}$ to $\frac{1}{2}$ that of the n-type impurity regions (b) 205a and 205b (typically between $\frac{1}{4}$ and $\frac{1}{3}$). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 27C:
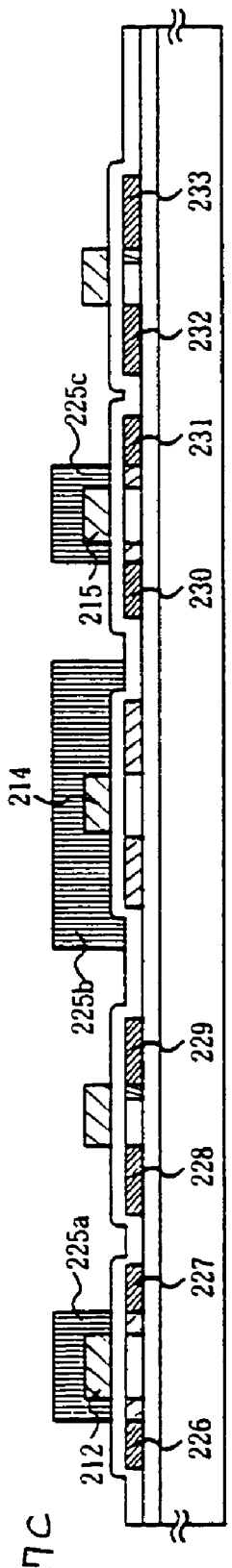

Resist masks 225a to 225c are formed next, with a shape covering the gate electrodes 212, 214 and 215, as shown in FIG. 27C, and an n-type impurity element (phosphorous is used in Example 5) is added, forming impurity regions (a) 226 to 233 containing phosphorous at high concentration. Ion doping using phosphine (PH$_3$) is also performed here, and the phosphorous concentration of these regions is regulated so as to be set to from $1\times10^{20}$ to $1\times10^{21}$ atoms/cm$^3$ (typically between $2\times10^{20}$ and $5\times10^{21}$ atoms/cm$^3$).

A source region or a drain region of the n-channel TFT is formed by this process, and in the n-channel TFT, a portion of then-type impurity regions (c) 217, 218, 222, and 223 formed by the process of FIG. 27B is remained. These remaining regions correspond to LDD regions.

Figure 27D:
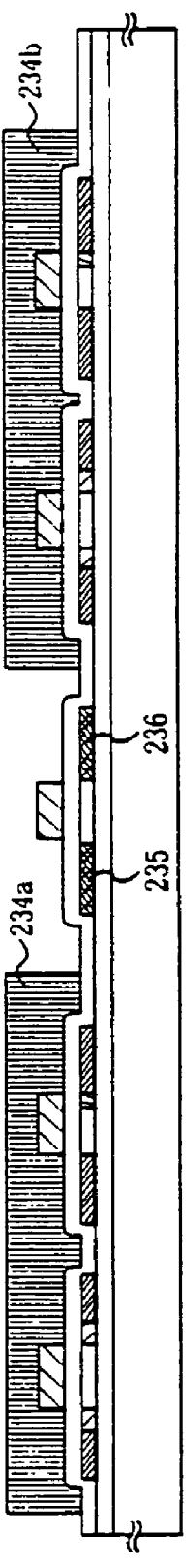
Figure 29A:
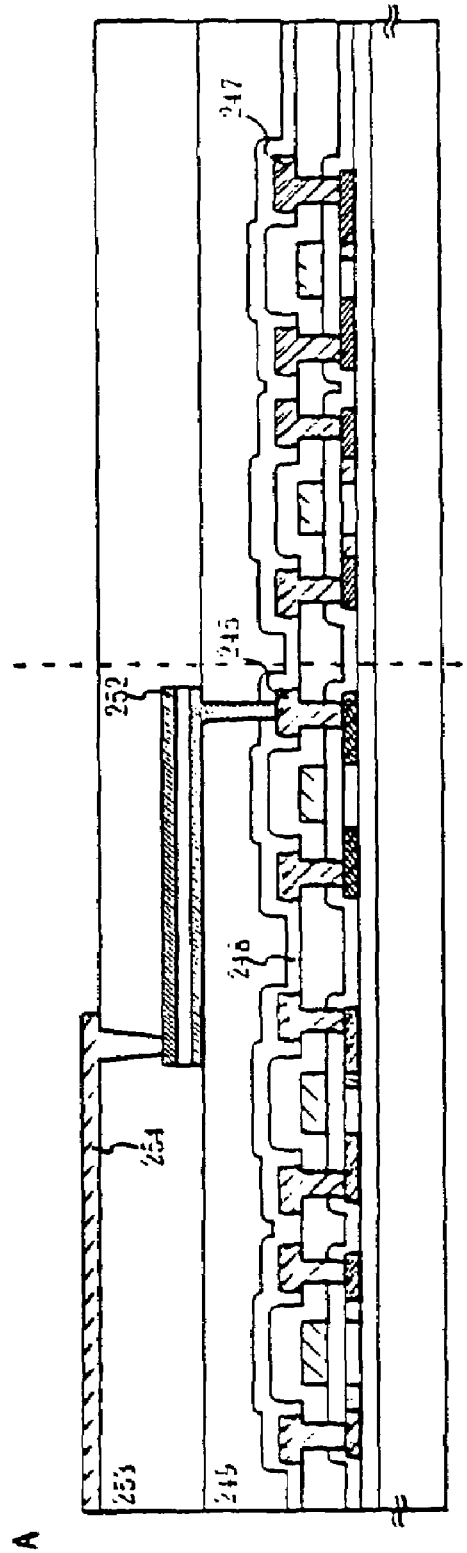
FIGS. 29A and 29B are views showing steps of fabricating an image sensor according to the invention.
Figure 29B:
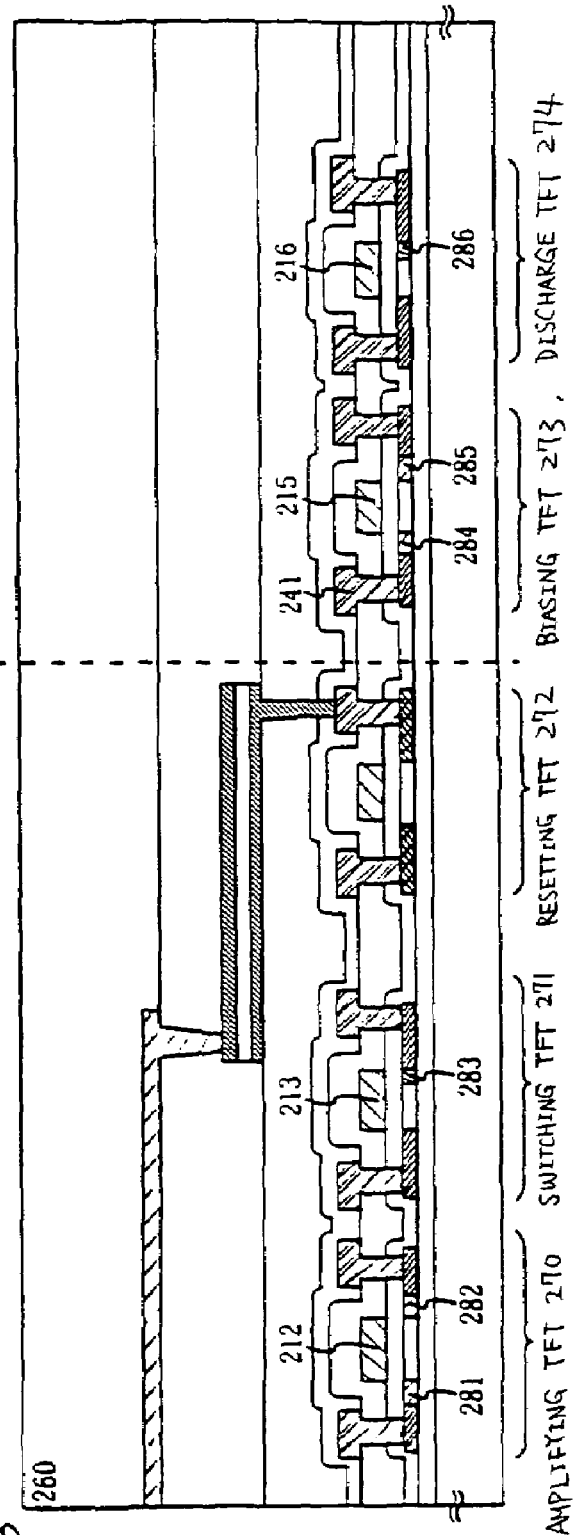

Next, as shown in FIG. 27D, the resist masks 225a to 225c are removed, and new resist masks 234a and 234b are formed. A p-type impurity element (boron is used in Example 5) is then added, forming p-type impurity regions 235 and 236 containing boron at high concentration. Boron is added here at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 235 and 236 at a concentration of $1\times10^{20}$ to $1\times10^{21}$ atoms/cm$^3$, but boron is added here at a concentration of at least 3 times or more that of the phosphorous. Therefore, the n-type impurity regions already formed completely invert to p-type, and function as p-type impurity regions.

Next, after removing the resist masks 234a and 234b, the n-type or p-type impurity elements added to the active layer at respective concentrations are activated. Furnace annealing, laser annealing or lamp annealing can be used as a means of activation. In Example 5, heat treatment is performed for 4 hours at 550° C. in a nitrogen atmosphere in an electric furnace.

At this time, it is important to eliminate oxygen from the surrounding atmosphere as much as possible. This is because an exposed surface of the gate electrode is oxidized, which results in an increased resistance if only a small amount of oxygen exists. Accordingly, the oxygen concentration in the surrounding atmosphere for the activation process is set at 1 ppm or less, preferably at 0.1 ppm or less.

A first interlayer insulating film 237 is formed next, as shown in FIG. 28A. A single layer insulating film containing silicon is used as the first interlayer insulating film 237, or a lamination film may be used. Further, a film thickness of between 400 nm and 1.5 μm may be used. A lamination structure of a silicon oxide film having a thickness of 800 nm on a silicon oxinitride film having a thickness of 200 nm thick is used in Example 5.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally excited. Plasma hydrogenation (using hydrogen excited by plasma) may also be performed as another means of hydrogenation.

Note that the hydrogenation processing may also be inserted during the formation of the first interlayer insulating film 237. Namely, hydrogen processing may be performed as above after forming the 200 nm thick silicon oxinitride film, and then the remaining 800 nm thick silicon oxide film may be formed.

Next, a contact hole is formed in the gate insulating film 211 and the first interlayer insulating film 237, and source wirings 238 to 242 and drain wirings 243 to 247 are formed. In this Example, this electrode is made of a laminate film of three-layer structure in which a titanium film having a thickness of 100 nm, an aluminum film containing titanium and having a thickness of 300 nm, and a titanium film having a thickness of 150 nm are continuously formed by sputtering. Of course, other conductive films may be used.

A first passivation film 248 is formed next with a thickness of 50 to 500 nm (typically between 200 and 300 nm). A 300 nm thick silicon oxinitride film is used as the first passivation film 248 in Example 5. This may also be substituted by a silicon nitride film. Note that it is effective to perform plasma processing using a gas containing hydrogen such as H$_2$ or NH$_3$ before the formation of the silicon oxinitride film. Hydrogen activated by this preprocess is supplied to the first interlayer insulating film 237, and the film quality of the first passivation film 248 is improved by performing heat treatment. At the same time, the hydrogen added to the first interlayer insulating film 237 diffuses to the lower side, and the active layers can be hydrogenated effectively.

Reference numeral 270 shows an amplifying TFT, 271 shows a switching TFT, 272 shows a resetting TFT, 273 shows a biasing TFT and 274 shows a discharge TFT.

In Example 5, the amplifying TFT 270 and the biasing TFT 273 are n-channel TFTs, and both of source region side and drain region side have LDD regions 281 to 284. Note that the LDD regions 281 to 284 do not overlap with the gate electrodes 212 and 215 through the gate insulating film 211. The above constitution of the amplifying TFT 270 and the biasing TFT 273 can reduce the hot carrier injection as much as possible.

The formation of the LDD regions 283 and 286 on only the drain region side is in consideration of reducing the hot carrier injection and not causing the operating speed to drop. Further, it is not necessary to be too concerned with the value of the off current for the switching TFT 271 and the discharge TFT 274, and more importance may be placed on the operating speed. It is therefore preferable for the LDD regions 283 and 286 to completely overlap with the gate electrodes 213 and 216, and to reduce resistive components as much as possible. Namely, the so-called offset should be eliminated. In particular, when the source signal line driver circuit or the gate signal line driving circuit is driven at 15V to 20V, the above constitution of the discharge TFT 274 of the Example 5 is effective to reduce the hot carrier injection and also not to drop the operation speed.

Furthermore, in Example 5, a resetting TFT 272 is p-channel TFT and has no LDD region. Degradation due to hot carrier injection is almost of no concern for the p-channel TFTs, and therefore LDD regions do not have to be formed in particular. It is also possible, of course, to form an LDD region similar to that of an n-channel TFT to take action against hot carriers. Further, the resetting TFT 272 may be an n-channel type TFT.

Further, by attaching a connector (flexible printed circuit, FPC) for connecting terminals pulled around from the elements or circuits formed on the substrate with external signal terminals, the sensor is completed.

Note that it is possible to freely combine Example 5 with Examples 1 to 4.

Example 6

The sensor formed by implementing the present invention can be used in various electronic apparatus. As such electronic apparatus of the invention, there are pointed out a scanner, a digital still camera, an X-ray camera, a portable information terminal (a mobile computer, a portable telephone, a portable game machine), a note-type personal computer, a game machine and a television telephone.

FIG. 30A shows a scanner 3001 using the close contact type sensor and including a sensor portion 3002. The scanner 3001 is arranged above a reading object 3003. As light therefor, light in the room is utilized. Thereby, an exclusive light source is not needed. The present invention can be used in the sensor portion 3002.

In FIG. 30B, in contrast to FIG. 30A, an exclusive light source 3007 is arranged. When positions of a reading region and a sensor portion 3005 are aligned, the light source 3007 is lifted thereabove. Further, positions thereof are aligned by viewing a reading object 3006 via an irradiation window of the sensor portion 3005. In reading an image, the light source 3007 and a scanner 3004 are overlapped and used. The present invention can be used in the sensor portion 3005.

Figure 31A:
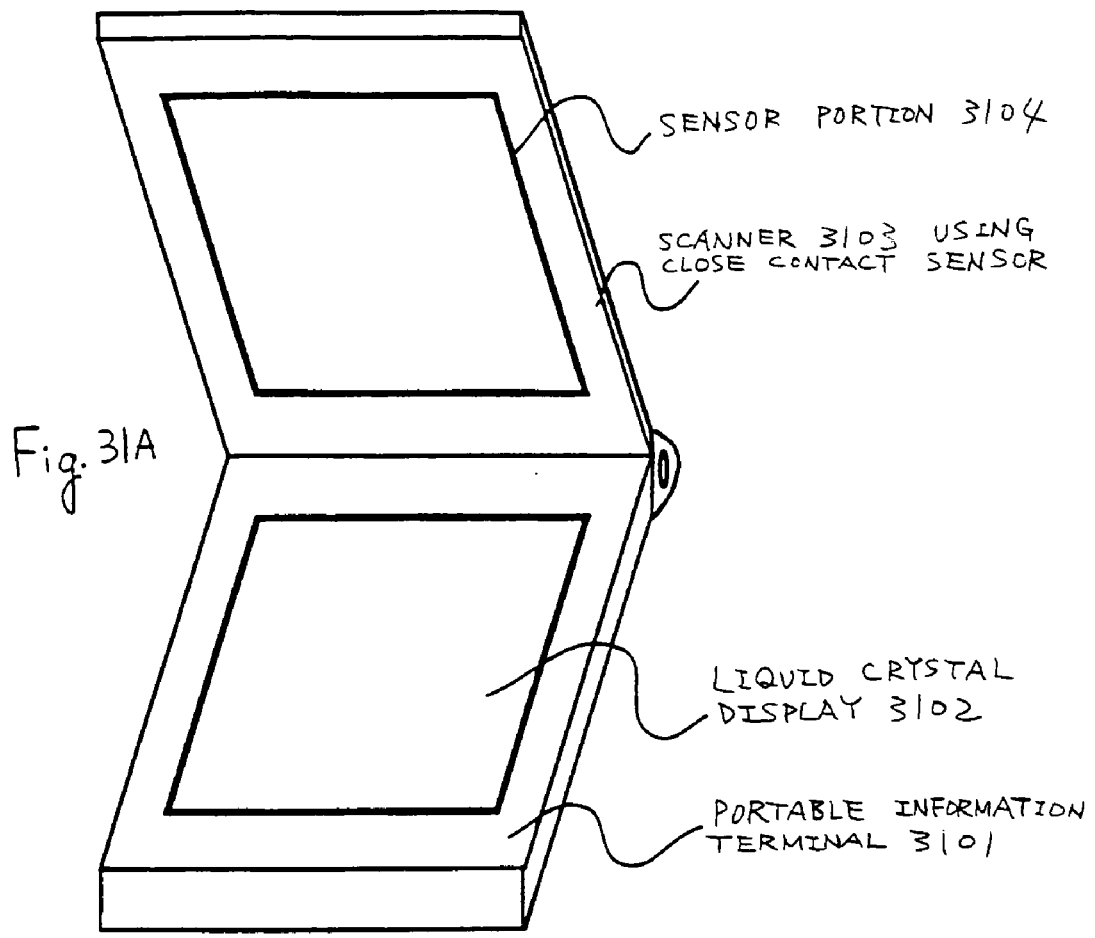
FIGS. 31A and 31B are views of an electronic apparatus using an image sensor according to the invention.
Figure 31B:
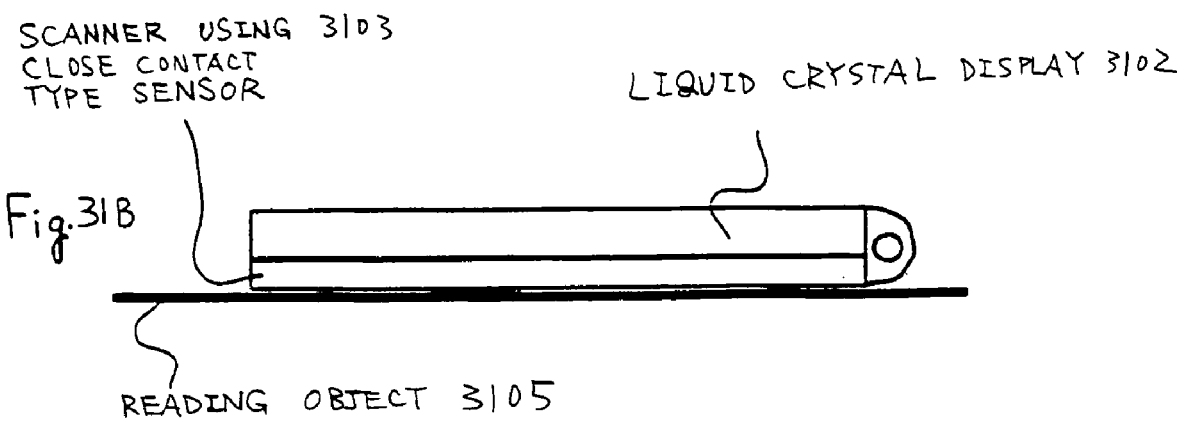

FIG. 31A shows a portable information terminal 3101 including a liquid crystal display 3102, a scanner 3103 using the close contact type sensor and a sensor portion 3104. When the scanner is used, as shown by a sectional view of FIG. 31B, the liquid crystal display 3102 and the scanner 3103 are overlapped, the scanner 3001 is arranged above a reading object 3005 and the liquid crystal display 3102 is arranged thereabove. As irradiation light, light of the liquid crystal display 3102 is utilized. Thereby, an exclusive light source is not needed. The present invention can be used in the sensor portion 3002.

Figure 32:
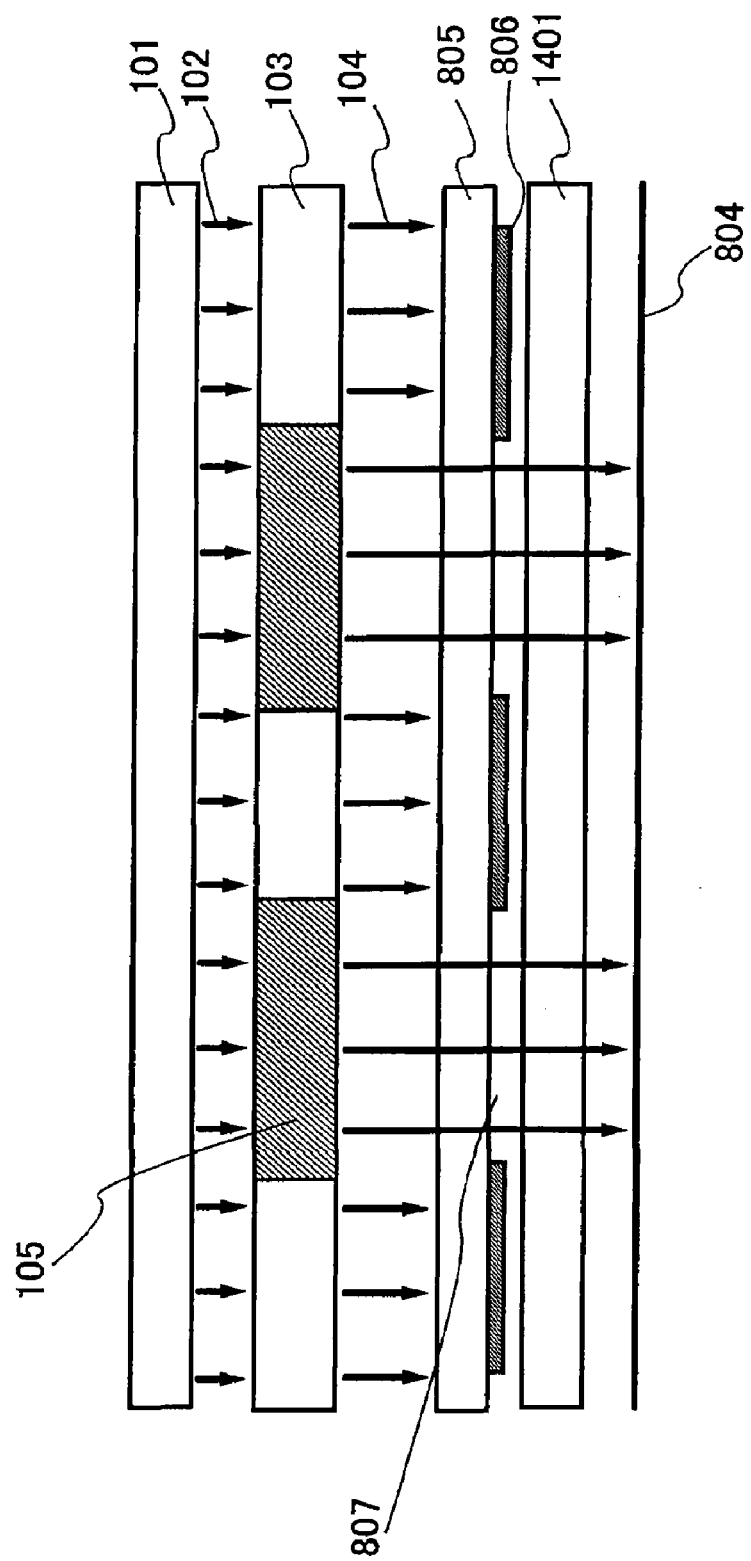
FIG. 32 is a sectional view of a close contact type sensor.

FIG. 32 shows an optical fiber plate 1401 arranged between the light receiving portion 806 and the reading object 804.

According to the present invention, light incident on a light receiving portion can be increased. Therefore, a signal is enlarged and image quality of a sensor is promoted. Further, light can be transmitted through an irradiation window efficiently and therefore, wasteful light is reduced. As a result, the light utilizing efficiency is promoted.

What is claimed is:

1. A sensor comprising:
    a plurality of pixels, each of said pixels comprising a light receiving portion and a transistor;
    a liquid crystal display; and
    a backlight,
    wherein the light receiving portion includes an electrode having a plurality of openings,
    wherein the electrode is connected to the transistor, and
    wherein the liquid crystal display and the plurality of pixels are arranged between the backlight and a reading object.

2. A sensor according to claim 1, wherein the sensor is incorporated in a scanner.

3. A sensor according to claim 1, wherein the sensor is incorporated in a portable information terminal.

4. A sensor according to claim 1, further comprising an optical fiber plate,
    wherein the optical fiber plate is arranged between the plurality of pixels of the sensor and the reading object.

5. A sensor according to claim 1, wherein the electrode overlaps the transistor.

6. A sensor according to claim 1, wherein the plurality of pixels are arranged two-dimensionally.

7. A sensor comprising:
    a plurality of pixels, each of said pixels comprising a light receiving portion and a transistor;
    a liquid crystal display; and
    a backlight,
    wherein the light receiving portion includes an electrode having a plurality of openings,
    wherein the electrode is connected to the transistor,
    wherein in the liquid crystal display, a single piece of a unit pixel is constituted by one pixel for red, one pixel for green and one pixel for blue, and
    wherein the liquid crystal display and the plurality of pixels are arranged between the backlight and a reading object.

8. A sensor according to claim 7, wherein the sensor is incorporated in a scanner.

9. A sensor according to claim 7, wherein the sensor is incorporated in a portable information terminal.

10. A sensor according to claim 7, wherein a size of the unit pixel of the liquid crystal display is an integral multiple of the pixel of the sensor or of an integer fraction thereof.

11. A sensor according to claim 7, further comprising an optical fiber plate,
   wherein the optical fiber plate is arranged between the plurality of pixels of the sensor and the reading object.

12. A sensor according to claim 7, wherein a light emitted from the backlight successively transmits through the pixel for red, the pixel for green and the pixel for blue of the liquid crystal display at every respective subframe period.

13. A sensor according to claim 7, wherein the electrode overlaps the transistor.

14. A sensor according to claim 7, wherein the plurality of pixels are arranged two-dimensionally.

* * * * *

UNITED STATES PATENT AND TRADEMARK OFFICE
CERTIFICATE OF CORRECTION

PATENT NO. : 7,279,673 B2  Page 1 of 1
APPLICATION NO. : 11/053852
DATED : October 9, 2007
INVENTOR(S) : Hajime Kimura It is certified that error appears in the above-identified patent and that said Letters Patent is hereby corrected as shown below:

PLEASE INSERT ON THE TITLE PAGE, ITEM (73), TO READ

(73) Assignee: Semiconductor Energy Laboratory Co., Ltd, Atsugi-shi, (JP) Kanagawa-ken Signed and Sealed this Eighteenth Day of March, 2008

JON W. DUDAS
*Director of the United States Patent and Trademark Office*